US008461533B2

(12) United States Patent
Findlay

(10) Patent No.: US 8,461,533 B2
(45) Date of Patent: Jun. 11, 2013

(54) RADIATION SENSOR

(75) Inventor: Ewan Findlay, Dollar (GB)

(73) Assignee: STMicroelectronics (Research & Development) Ltd, Marlow, Buckinghamshire (GB)

( * ) Notice: Subject to any disclaimer, the term of this patent is extended or adjusted under 35 U.S.C. 154(b) by 7 days.

(21) Appl. No.: 13/238,551

(22) Filed: Sep. 21, 2011

(65) Prior Publication Data

US 2012/0132809 A1 May 31, 2012

(30) Foreign Application Priority Data

Nov. 25, 2010 (GB) .................................. 1020024.4

(51) Int. Cl.
*G01J 5/02* (2006.01)

(52) U.S. Cl.
USPC ........................................................ 250/353

(58) Field of Classification Search
USPC ................... 250/330–335, 336.1–336.2, 337, 250/338.1–338.5, 339.01–339.15, 340, 341.1–341.8, 342–353
See application file for complete search history.

(56) References Cited

U.S. PATENT DOCUMENTS

| 4,972,089 | A | 11/1990 | Stevenson |
| 5,130,531 | A | 7/1992 | Ito et al. |
| 5,382,810 | A | 1/1995 | Isaksson |
| 5,448,395 | A | 9/1995 | Lopez et al. |
| 5,684,294 | A | 11/1997 | Kouhi |
| 7,123,154 | B1 | 10/2006 | Smith |
| 7,262,402 | B2 | 8/2007 | Niclass et al. |
| 7,309,855 | B2 | 12/2007 | Nagasaka et al. |
| 7,375,803 | B1 | 5/2008 | Bamji |
| 2004/0012029 | A1* | 1/2004 | Bawolek et al. ................. 257/98 |
| 2006/0091293 | A1 | 5/2006 | Grueger et al. |
| 2006/0146330 | A1 | 7/2006 | Maniam |
| 2007/0212681 | A1 | 9/2007 | Shapiro et al. |
| 2008/0006762 | A1 | 1/2008 | Fadell et al. |
| 2008/0219672 | A1 | 9/2008 | Tam et al. |
| 2009/0219432 | A1 | 9/2009 | Palum et al. |
| 2009/0302329 | A1 | 12/2009 | Noma et al. |
| 2010/0085468 | A1 | 4/2010 | Park et al. |
| 2010/0127159 | A1 | 5/2010 | Watanabe |
| 2010/0277075 | A1 | 11/2010 | Rees |
| 2010/0282953 | A1 | 11/2010 | Tam |

(Continued)

FOREIGN PATENT DOCUMENTS

| DE | 10201746 A1 | 8/2002 |
| EP | 1351319 A2 | 10/2003 |

(Continued)

OTHER PUBLICATIONS

UK Search Report mailed Jan. 19, 2011 for GB 1020024.4 (1 page).

*Primary Examiner* — Kiho Kim
(74) *Attorney, Agent, or Firm* — Gardere Wynne Sewell LLP

(57) ABSTRACT

A radiation sensor includes first and second pixels with a radiation absorption filter positioned over the first pixel and an interference filter positioned over both the first and second pixels. The combined spectral response of the absorption filter and the first pixel has a first pixel pass-band and a first pixel stop-band. The spectral response of the interference filter has an interference filter pass-band which is substantially within the first pixel pass-band for radiation incident on the interference filter at a first angle of incidence, and substantially within the first pixel stop-band for radiation incident on the interference filter at a second angle of incidence greater than the first angle of incidence.

34 Claims, 22 Drawing Sheets

U.S. PATENT DOCUMENTS

| | | |
|---|---|---|
| 2011/0086676 A1 | 4/2011 | Choi et al. |
| 2012/0087645 A1 | 4/2012 | Wu et al. |

FOREIGN PATENT DOCUMENTS

| | | |
|---|---|---|
| EP | 1764835 A1 | 3/2007 |
| JP | 10154825 A | 6/1998 |
| JP | 11261493 A | 9/1999 |
| JP | 11289105 A | 10/1999 |
| WO | WO-2009022282 A2 | 2/2009 |
| WO | WO-2009120568 A2 | 10/2009 |
| WO | WO-2010032306 A1 | 3/2010 |

* cited by examiner

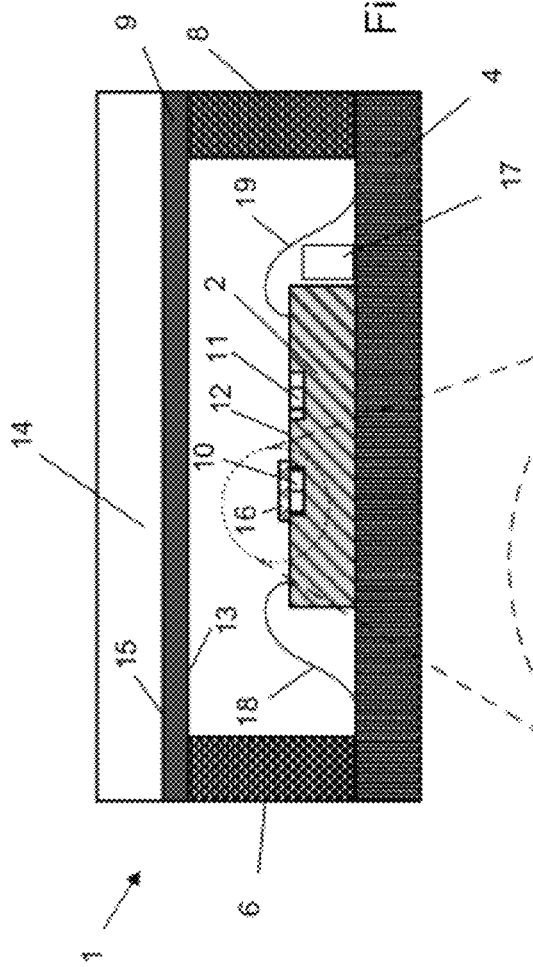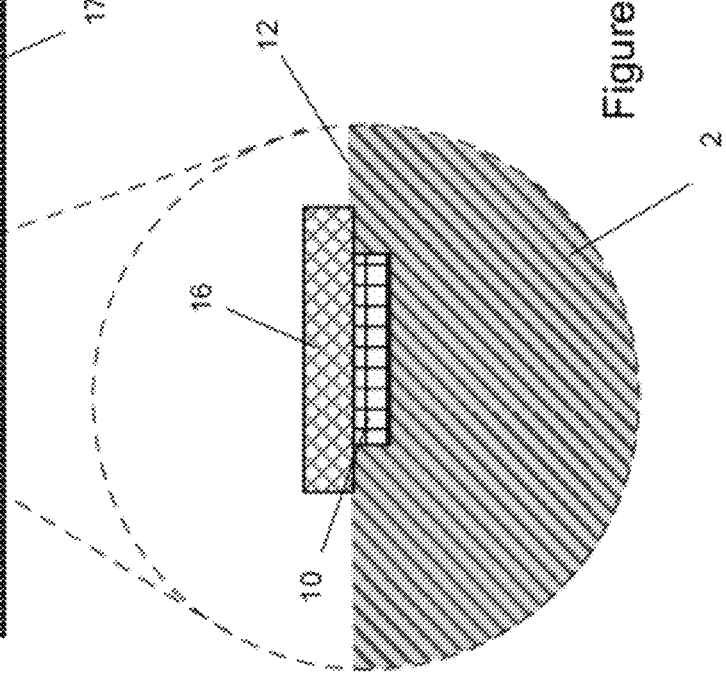

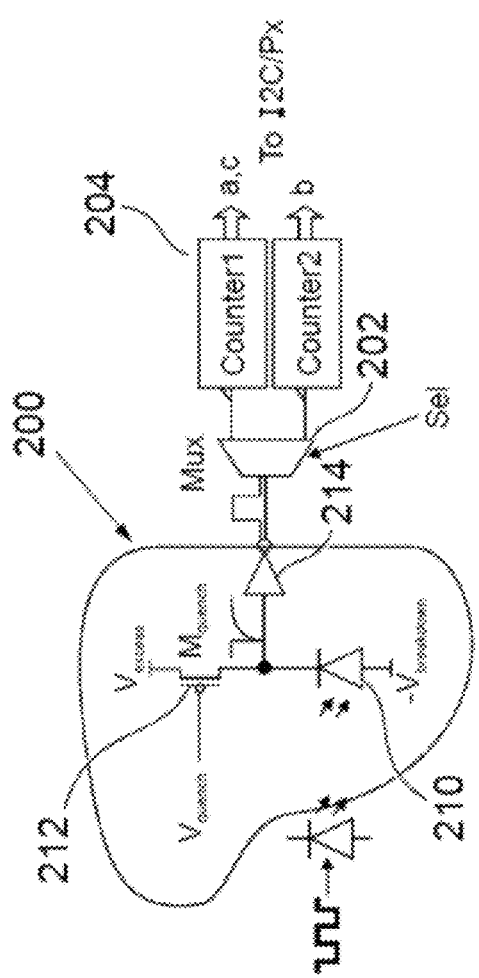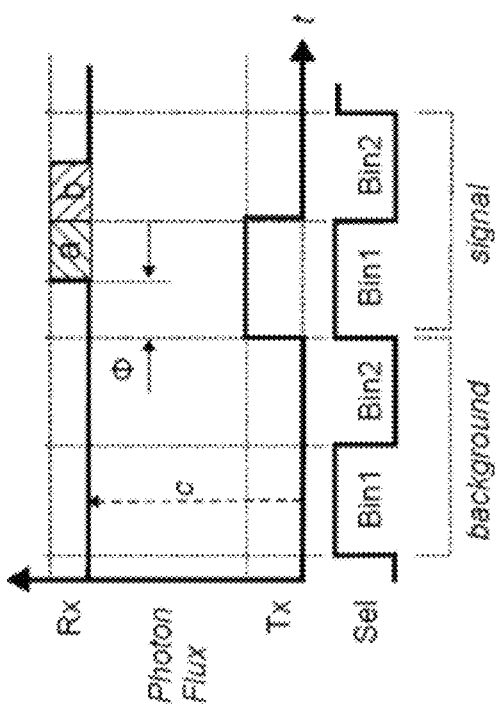
Figure 12

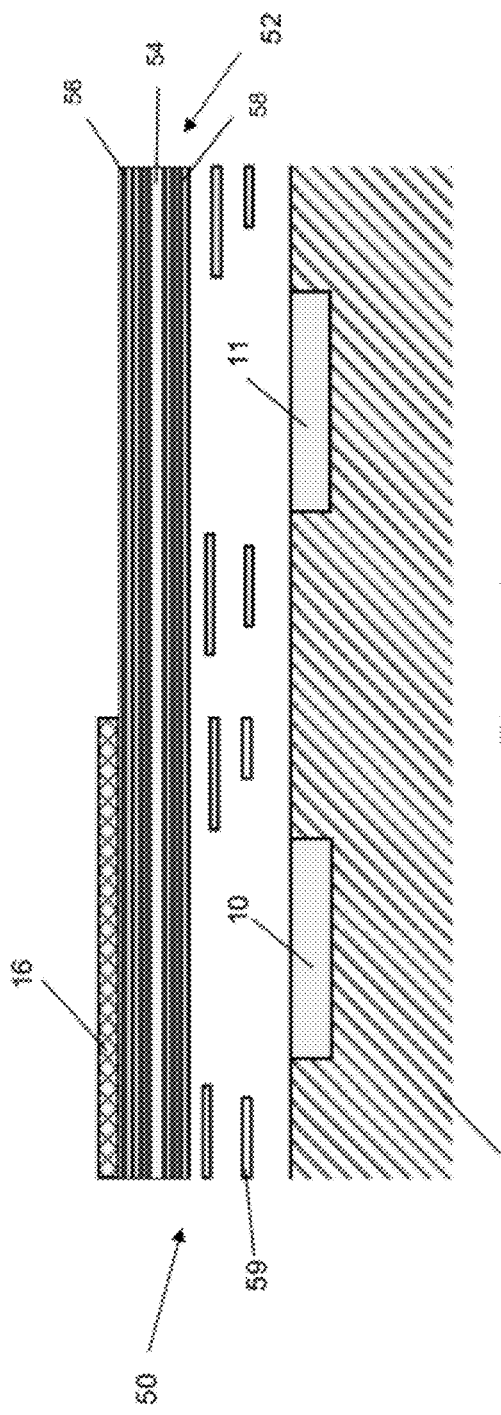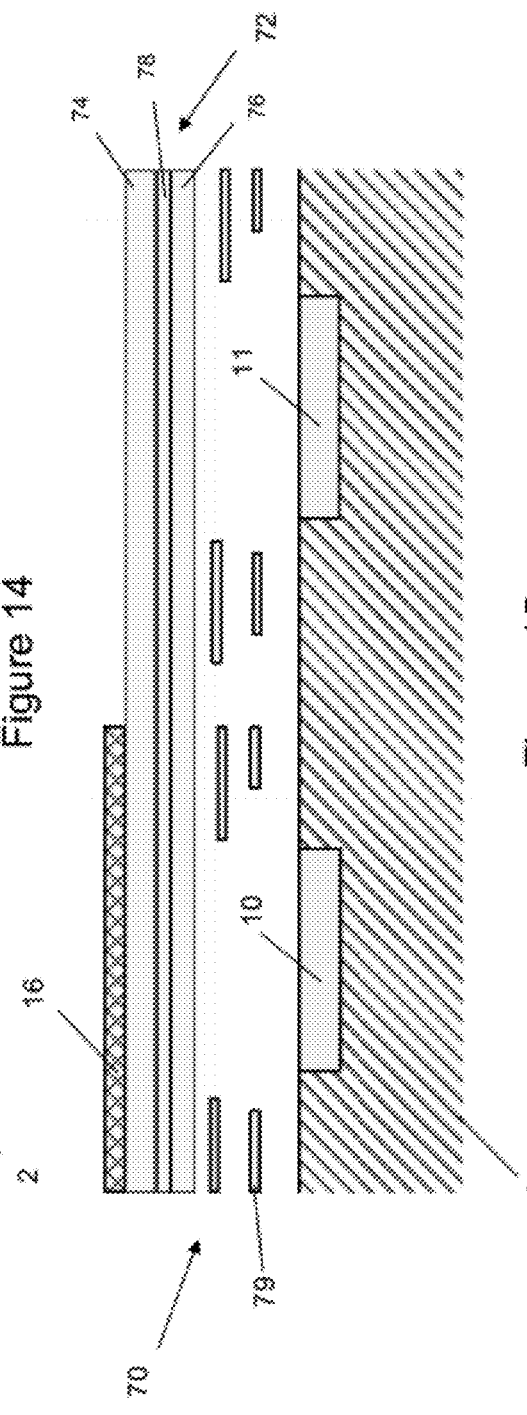

RADIATION SENSOR

PRIORITY CLAIM

This application claims priority from United Kingdom Patent Application No. 1020024.4 filed Nov. 25, 2010, the disclosure of which is hereby incorporated by reference.

TECHNICAL FIELD

The invention relates to a radiation sensor, a combined proximity and ambient light sensor and a method of manufacturing a radiation sensor.

BACKGROUND

Ambient light sensors typically comprise a relatively small number (from a single pixel up to, for example, a 10×10 pixel array) of exposed light sensitive pixels (compared to, for example, a camera module image sensor) for providing an indication of ambient light levels. Only a small number of pixels is required because it is not necessary for ambient light sensors to be capable of capturing a sharp image. They are used in many applications, including on mobile communications devices (such as mobile phones and PDAs), laptops, tablet computers, web-cams and the like.

Proximity sensors typically comprise a radiation source and a corresponding detector, the detector again comprising a relatively small number of exposed light sensitive pixels. Proximity sensing is achieved by: emitting light from the radiation source; capturing light which is reflected back to the detector by an object; and processing the reflected light to determine the proximity of the object to the sensor. Proximity sensors are also used in many applications, including on mobile communications devices and vehicle parking sensors.

Ambient light and proximity sensors are typically formed on separate chips with separate sensor windows. Therefore, when they are both used together in a single device, the separate ambient light and proximity sensors have separate footprints and require separate sensor windows in the device casing.

SUMMARY

A first aspect of the disclosure provides a radiation sensor comprising: first and second pixels; a radiation absorption filter positioned over the first pixel, the combined spectral response of the absorption filter and the first pixel having a first pixel pass-band and a first pixel stop-band; and an interference filter positioned over the first and second pixels, the spectral response of the interference filter having an interference filter pass-band which is substantially within the first pixel pass-band for radiation incident on the interference filter at a first angle of incidence, and substantially within the first pixel stop-band for radiation incident on the interference filter at a second angle of incidence greater than the first angle of incidence.

Typically at least part of the first pixel pass-band is in the infrared spectral region, while at least part of the first pixel stop-band is in the visible spectral region.

Preferably, the first and second pixels are formed on a common substrate. More preferably the first and second pixels are part of the same pixel array. In one embodiment, the first pixel is adjacent to the second pixel. In one embodiment, the first and second pixels are provided under a common sensor window which may, for example, be formed in a casing in which the sensor is housed.

Typically, the interference filter pass-band has a full-width-half-maximum bandwidth which is less than the full-width-half-maximum bandwidth of the first pixel pass-band and/or the interference filter pass-band has a full-width-half-maximum bandwidth which is less than the full-width-half-maximum bandwidth of the first pixel stop-band.

Additionally or alternatively, the interference filter pass-band has a full-width-half-maximum bandwidth which is less than the 10 dB bandwidth of the first pixel pass-band and/or the interference filter pass-band has a full-width-half-maximum bandwidth which is less than the 10 dB bandwidth of the first pixel stop-band.

The 10 dB bandwidth is the difference between the lower and upper wavelength limits of the pass-band, the lower and upper limits being defined as the wavelengths at which the peak transmittance of the pass-band is reduced by 10 dB.

In one embodiment, the radiation absorption filter is a high-pass filter configured to transmit radiation having a wavelength above a predetermined threshold.

The angle of incidence is the angle between a ray of radiation incident on a surface of the interference filter and the normal to that surface. Typically, the first and second angles of incidence are less than 90°.

Radiation incident on the interference filter at the first angle of incidence may be detected by the first pixel and a substantial portion of the radiation incident on the interference filter at the second angle of incidence may not be detected by the first pixel (said portion being blocked by the radiation absorption filter). The combination of the interference filter and the radiation absorption filter therefore provides the first pixel with a restricted field of view.

A radiation absorption filter is not typically provided over the second pixel. Therefore, a substantial portion of the radiation incident on the interference filter at the second angle of incidence may still be detected by the second pixel. Thus, the second pixel may be provided with a wider field of view than the first pixel.

As radiation absorption filters can be applied selectively to pixels of a pixel array (for example by photo-lithography), the first and second pixel can be provided as part of the same pixel array. In one embodiment, the first and second pixels may be adjacent pixels of a pixel array.

Preferably, the radiation sensor further comprises a lens substantially positioned over the first and second pixels. In one embodiment, the lens is a Fresnel lens.

In one embodiment, a plurality of lenslets or a diffractive optical element is positioned over the first and second pixels.

The interference filter may be provided between the lens, lenslets or diffractive optical element and the pixels. More preferably, the lens, lenslets or diffractive optical element is/are positioned between the interference filter and the pixels.

Typically, the lens, lenslets or diffractive optical element is/are provided to focus light onto the first and second pixels.

Preferably the interference filter comprises a pair of opposing planar reflectors. In this case, typically, the interference filter pass-band may be substantially within the first pixel pass-band for radiation incident on an external surface of one of the planar reflectors of the interference filter at the first angle of incidence, and substantially within the first pixel stop-band for radiation incident on said external surface of said planar reflector at the second angle of incidence.

Typically, one or both of the opposing planar reflectors are only partially reflective.

In one embodiment, the interference filter is provided on a substrate. In this case, the interference filter may be formed by a coating applied to the substrate.

Preferably the interference filter comprises a Fabry-Perot etalon filter. However, any other suitable optical thin film interference filter may be used. In one embodiment, a number of pass-bands can be realised in the interference filter, and multi-band information can be extracted by providing different pixels with radiation absorption filters having different wavelength pass-bands.

Typically, the radiation absorption filter comprises an organic resist applied to a sensing surface of the first pixel.

In one embodiment, the first pixel stop-band substantially comprises (preferably all) wavelengths between 513 nm and 608 nm. However, said stop-band may comprise all wavelengths between 350 nm and 700 nm.

Additionally the first pixel pass-band may comprise wavelengths exceeding 700 nm.

In a preferred embodiment, the interference filter comprises a second interference filter pass-band, the interference filter being configured such that the second interference filter pass-band is substantially within the first pixel stop-band for radiation incident on the interference filter at the first angle of incidence.

A second aspect of the disclosure provides a combined proximity and ambient light sensor comprising: first and second pixels; a radiation absorption filter positioned over the first pixel, the combined spectral response of the absorption filter and the first pixel having a first pixel pass-band and a first pixel stop-band; and an interference filter positioned over the first and second pixels, the spectral response of the interference filter having an interference filter pass-band which is substantially within the first pixel pass-band for radiation incident on the interference filter at a first angle of incidence, and substantially within the first pixel stop-band for radiation incident on the interference filter at a second angle of incidence greater than the first angle of incidence.

In one embodiment, the combined proximity and ambient light sensor according to the second aspect of the disclosure further comprises a radiation source. The radiation source may be, for example but not exclusively, a (preferably modulated) light emitting diode or a (preferably modulated) semiconductor laser diode. In one embodiment, the radiation source is mounted in a separate package or a separate package compartment from the first and second pixels to provide optical isolation between the source and the pixels.

In a preferred embodiment of the second aspect of the disclosure, a radiation source is provided, either separately or as part of the sensor, which has an emission spectrum having a full-width-half-maximum line-width which matches, or is greater than, the full-width-half-maximum line-width of the interference filter pass-band.

In one embodiment, the first pixel is used for proximity sensing. Additionally or alternatively, the second pixel is used for ambient light sensing. Additionally or alternatively, the first pixel may be used in combination with the second pixel for ambient light sensing.

A third aspect of the disclosure provides a method of manufacturing a radiation sensor comprising:
  a. providing first and second pixels;
  b. positioning a radiation absorption filter over the first pixel; and
  c. positioning an interference filter over the first and second pixels.

Preferably the combined spectral response of the absorption filter and the first pixel has a first pixel pass-band and a first pixel stop-band and wherein the interference filter has an interference filter pass-band which is substantially within the first pixel pass-band for radiation incident on the interference filter at a first angle of incidence, and substantially within the first pixel stop-band for radiation incident on the interference filter at a second angle of incidence greater than the first angle of incidence.

Typically the radiation absorption filter is deposited on a sensing surface of the first pixel by lithography during step b.

In one embodiment, the interference filter is integrally formed with the first and second pixels during step c. In this case, the interference filter may for example comprise a plurality of dielectric layers. In one embodiment, a spacer is positioned between two of the dielectric layers. Preferably, the spacer is formed from a material which has a lower refractive index than the dielectric layers. In an alternative embodiment, the interference filter is formed by applying a coating to a substrate mounted above the first and second pixels.

Preferably the method according to the third aspect of the disclosure further comprises:
  d. providing a plurality of first and second pixels;
  e. positioning a radiation absorption filter over each of the first pixels; and
  f. positioning an interference filter over the first and second pixels.

Typically the first and second pixels are provided as part of a pixel array during step a and/or step d.

BRIEF DESCRIPTION OF THE DRAWINGS

An embodiment of the disclosure will now be described, by way of example only, with reference to the drawings, in which:

FIGS. 1a and 1b are section views of a combined proximity and ambient light sensor;

FIG. 12 illustrates a possible implementation of a SPAD based proximity sensor with an associated wave diagram;

FIGS. 14 and 15 are schematic section views of two alternative sensors comprising interference filters which are integrally formed with the sensor pixels;

DETAILED DESCRIPTION OF THE DRAWINGS

Introduction

Figure 2:
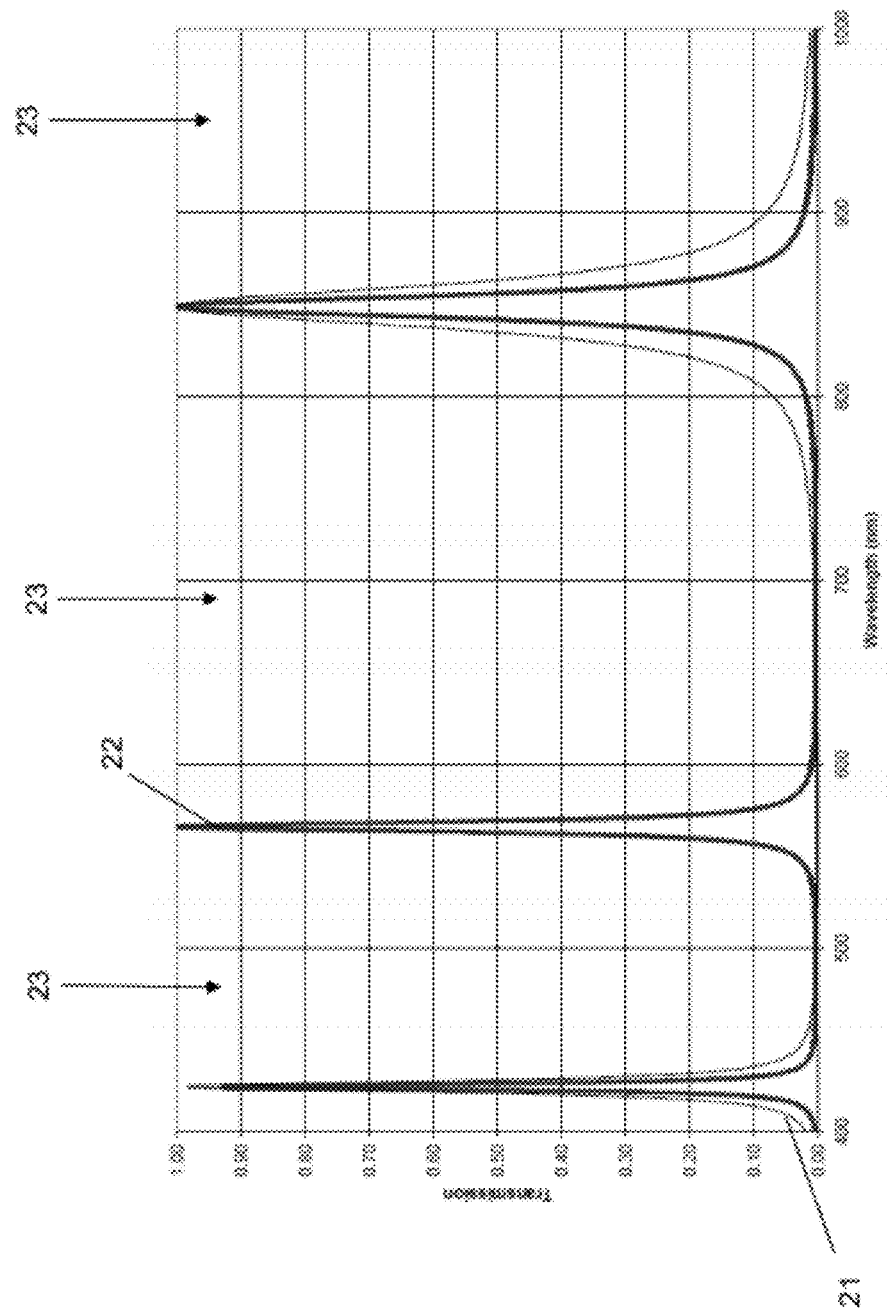
FIG. 2 shows the spectral responses of two interference filters.

It is desirable to combine a proximity sensor and an ambient light sensor onto a single chip for applications (such as in mobile communications devices) where both functions are required in order to reduce the combined footprint of the sensors. However, proximity sensing and ambient light sensing are subject to competing requirements. For example (as explained below), an ambient light sensor optimally detects only visible light, while a proximity detector optimally detects only radiation which matches the emission spectrum of a (typically infrared) radiation source. Integrating the combined functions of the ambient light sensor and the proximity detector onto a single sensor chip would require different pixels of the same pixel array to exhibit the required different spectral responses. However, there are no known materials suitable for being deposited onto a single pixel to transmit visible radiation and reject infrared radiation as required for the ambient light sensing function.

As the cost of developing such a material would be prohibitively high for this application, there is a need for an alternative filtering scheme using existing materials to allow the proximity and ambient light sensing functions to be integrated onto a single chip. The inventor has devised such as scheme, as explained below.

In addition, as will also be explained in more detail below, ambient light sensors require a wide field of view, while proximity sensors require a narrow field of view. A method of meeting these requirements for a combined proximity and ambient light sensor is therefore also required.

Combined Proximity and Ambient Light Sensor

FIG. 1a is a schematic section view of a combined proximity and ambient light sensor 1 comprising a sensor substrate 2 mounted on an opaque base 4 of a sensor housing. The housing further comprises opaque side walls 6, 8 which extend vertically between the base 4 and an interference filter 9 which is mounted on top of, and extends horizontally between, the opaque walls 6, 8. First and second pixels 10, 11 are formed on an upper surface 12 of the substrate 2 such that their sensing surfaces face a lower surface 13 of the interference filter 9. The interference filter 9 is positioned over both pixels 10, 11. A substantially transparent glass substrate 14 is formed on an upper surface 15 of the interference filter 9. The glass substrate 14 may act as a lens for focusing incident light onto the first and second pixels 10, 11.

The pixels 10, 11 are preferably single photon avalanche detectors (SPADs). A SPAD is based on a p-n junction device biased beyond its breakdown region. The high reverse bias voltage generates a sufficient magnitude of electric field such that a single charge carrier introduced into the depletion layer of the device can cause a self-sustaining avalanche via impact ionization. The avalanche is quenched, either actively or passively to allow the device to be "reset" to detect further photons. The initiating charge carrier can be photo-electrically generated by means of a single incident photon striking the high field region. It is this feature which gives rise to the name 'Single Photon Avalanche Diode'. This single photon detection mode of operation is often referred to as 'Geiger Mode'.

However, it will be understood that any other suitable detectors which are capable of converting incident light into an electrical signal may be used, such as silicon photodiodes configured in photoconductive mode.

As shown most clearly in FIG. 1b, a high-pass (IR-pass) radiation absorption filter 16 is positioned over (and is optionally formed on) the sensing surface of the first pixel 10. The radiation absorption filter 16 is typically a layered filter, each layer comprising a pigment carried in an organic resist material. By providing more layers, the edges of the filter response increase in sharpness. The radiation absorption filter 16 can be deposited and patterned on the first pixel 10 using standard semiconductor manufacturing processes such as photo-lithography. The sensor 1 is provided with separate readout circuitry 18, 19 for the first and second pixels 10, 11 respectively. A modulated radiation source 17 is also mounted on the opaque base 4.

Although shown schematically in FIG. 1a as being mounted within the same sensor housing as the pixels 10, 11, it will be understood that the source 17 may optionally be provided in a separate compartment of the sensor housing (adjacent to the compartment shown in FIG. 1a) to prevent internal propagation of radiation from the source 17 onto the pixels 10, 11 within the sensor package (i.e. without first bouncing off a target outside the package).

It will be understood that any suitable radiation source may be used, such as a modulated LED or a fast switching semiconductor laser diode.

The pixels 10, 11 shown in FIG. 1a are separated by a portion of the substrate 2. However, it will be understood that this is not necessary and that the pixels 10, 11 may, for example, alternatively be adjacent pixels in a pixel array. It will also be appreciated that a plurality of first and second pixels 10, 11 may be provided in a pixel array, a high-pass (IR-pass) radiation absorption filter 16 being positioned over each of the first pixels but not over each of the second pixels 11. In this case, the interference filter 9 is positioned over substantially all of the first and second pixels 10, 11 in the pixel array.

FIG. 2 is a plot of transmission versus wavelength illustrating the spectral responses 21, 22 of a pair of alternative interference filters 9, which in this example are Fabry-Perot etalon filters.

The transmission characteristic of a lossless Fabry-Perot etalon comprising two opposing parallel plane mirrors is given by the following equations:

$$\text{Transmission} = 1/[1 + F \cdot \sin^2(\delta/2)] \quad (1)$$

with:

$$F = (4 \cdot R)/(1-R)^2 \quad (2)$$

and:

$$\delta = (2\pi/\lambda_0) \cdot 2 \cdot n \cdot h \cdot \cos(\theta) \quad (3)$$

where:
R is the reflectivity of the two plane mirrors separated by a distance h of material with refractive index n
$\lambda_0$ is the reference (design) wavelength (in a vacuum) of incident light whose angle of incidence on the mirrors (within the etalon) is $\theta$.

The wavelength of interference (i.e. the design pass-band of the interference filter) of the etalon can be chosen by setting the etalon width h to give $\delta/2\pi$ an integer value. In addition, by selecting an appropriate integer value for $\delta/2\pi$, the wavelength of the neighboring interference maxima (i.e. pass-bands of the interference filter) can be selected (at least to a limited degree). For example, if $\delta/2\pi=1$, the neighboring maximum (pass-band) to the design pass-band occurs at $\lambda_0/2$. Similarly, if $\delta/2\pi=2$, the neighboring maximum (pass-band) to the design pass-band occurs at $2\lambda_0/3$.

Taking a reference wavelength ($\lambda_0$) of 850 nm, the first spectral response 21 shown in FIG. 2 comprises a first order pass-band centered at approximately 850 nm and a further pass-band centered at approximately 425 nm. The second spectral response 22 has a second order pass-band centered at approximately 850 nm and further pass-bands centered at approximately 567 nm and 425 nm. In each case, the interference filter spectral response comprises a corresponding series of stop-bands 23 extending between the pass-bands. In the embodiments described below, the interference filter 9 with the second spectral response 22 will be employed. However, it will be understood that an interference filter with the first spectral response 21 (or any other suitable response such as that shown in FIG. 21) may be alternatively employed.

Figure 3:
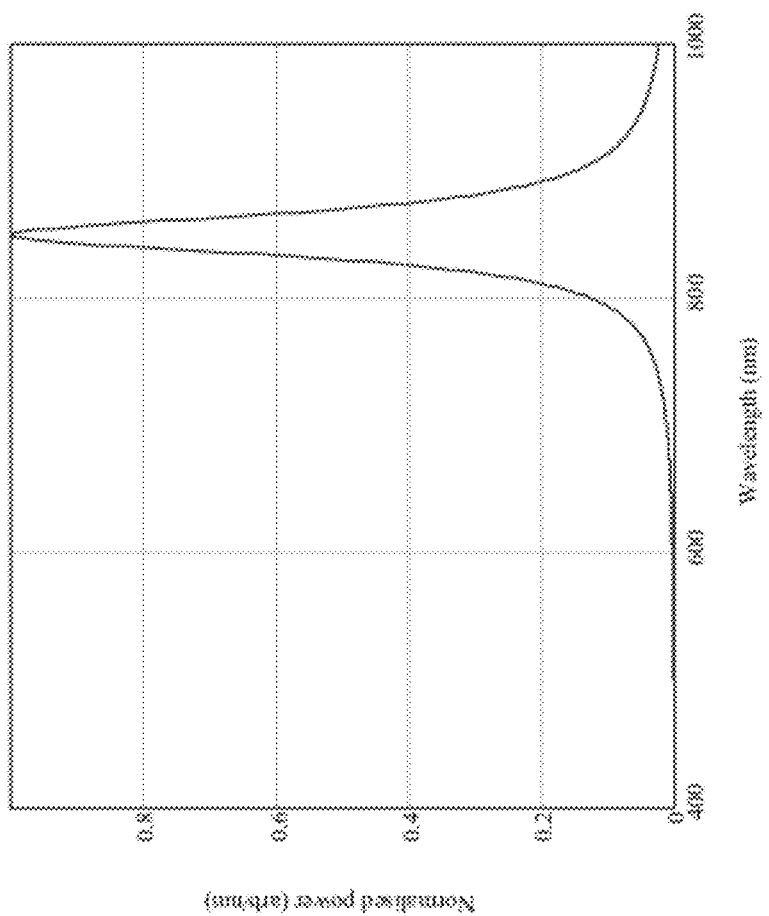
FIG. 3 shows an exemplary radiation source emission spectrum.

It will also be assumed that the radiation source 17 has an emission spectrum which is centered on 850 nm. This is illustrated in FIG. 3. However, it will be understood that any suitable radiation emission wavelength may be used (and that the interference filter 9 may be re-designed as appropriate such that the emission spectrum of the radiation source matches one of the etalon pass-bands—this will be explained further below).

Figure 4:
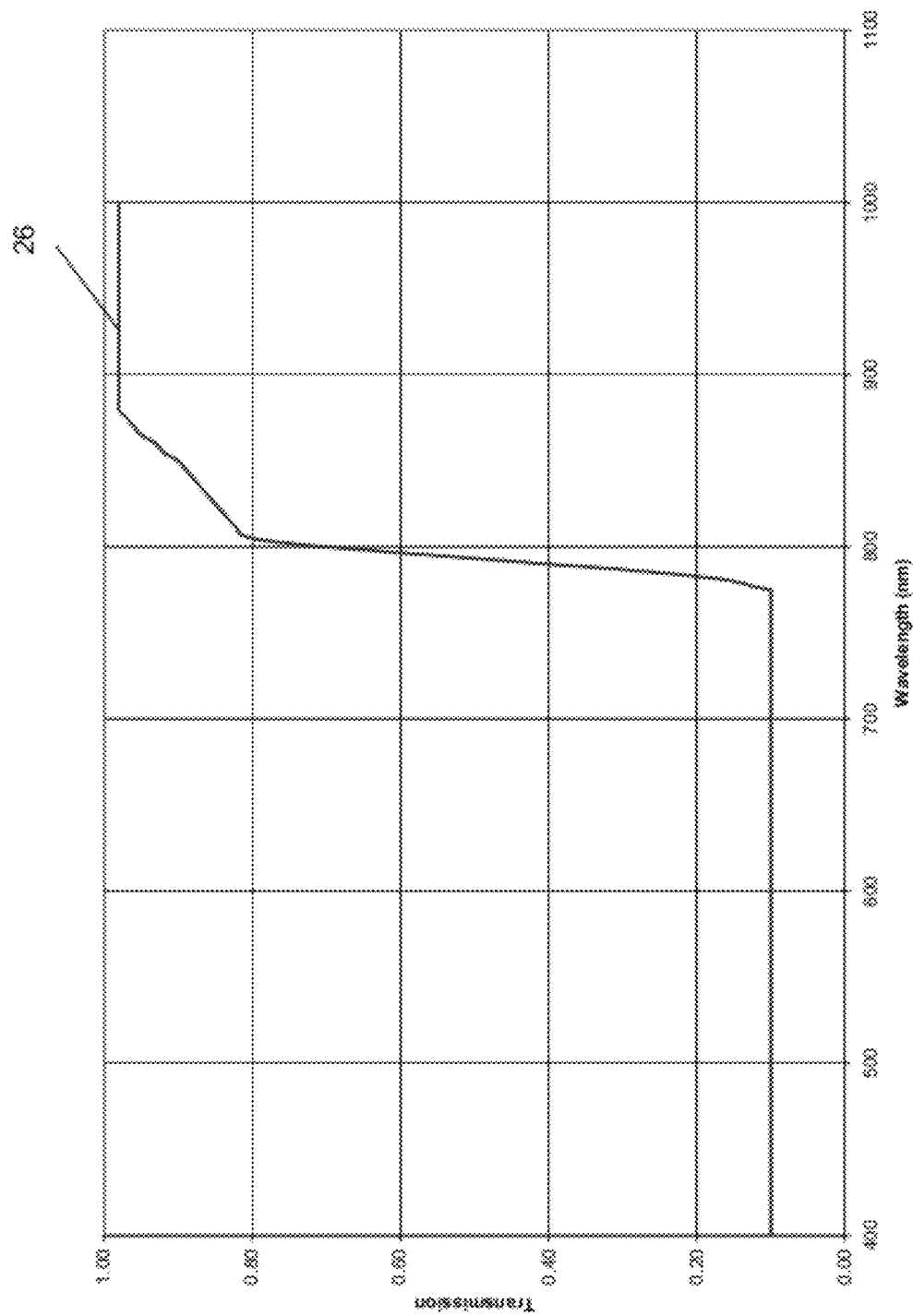
FIG. 4 shows the spectral response of a radiation absorption filter.

FIG. 4 is a plot of transmission versus wavelength illustrating the spectral response 26 of the high-pass (IR-pass) radiation absorption filter 16 comprising a pass-band above 800 nm (approximately) and a stop-band below ~780 nm. In the region between the stop-band and the pass-band, there is a gradual increase in transmission. The wavelengths of the pass-band and stop-band of the radiation absorption filter 16 typically depend on the molecular resonance frequency of the filter material. However, it will be understood that any other suitable alternative radiation absorption filter mechanism may be employed.

It will be understood that, in either the interference filter 9 or the radiation absorption filter 16, transmission in the "pass-band" is not necessarily 100% and that transmission in the "stop-band" is not necessarily 0% (although this is ideally the case). Rather, transmission in the pass-band is greater than transmission in the stop-band. Typically, transmission in the pass-band is at least five times greater than transmission in the stop-band. In the case of the spectral responses of the interference filters shown in FIG. 2, the transmission in the pass-bands is close to 100%, while the transmission in the stop-bands is close to 0%. However, in the case of the spectral response of the radiation absorption filter shown in FIG. 4, the transmission in the pass-band is approximately 80%-95%, while the transmission in the stop-band is approximately 10% (i.e. the transmission in the pass-band is approximately 8-9.5 times that in the stop-band).

Figure 5:
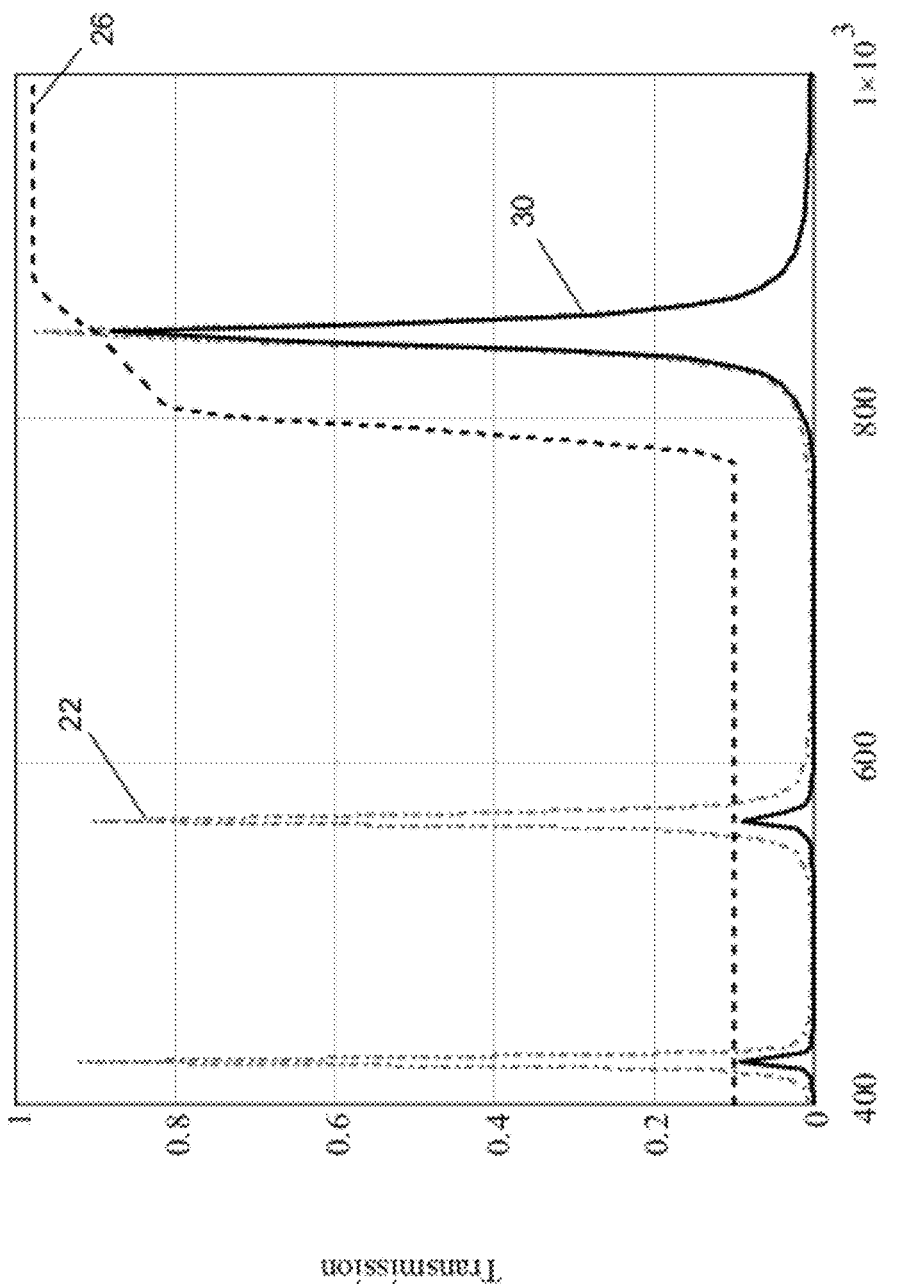
FIG. 5 shows the combined spectral response of one of the interference filters of FIG. 2 and the radiation absorption filter of FIG. 4.

FIG. 5 shows the combined spectral response 30 of the interference filter 9 (having the second spectral response 22 shown in FIG. 5) and the radiation absorption filter 16 (having the spectral response 26 also shown in FIG. 5).

Figure 6:
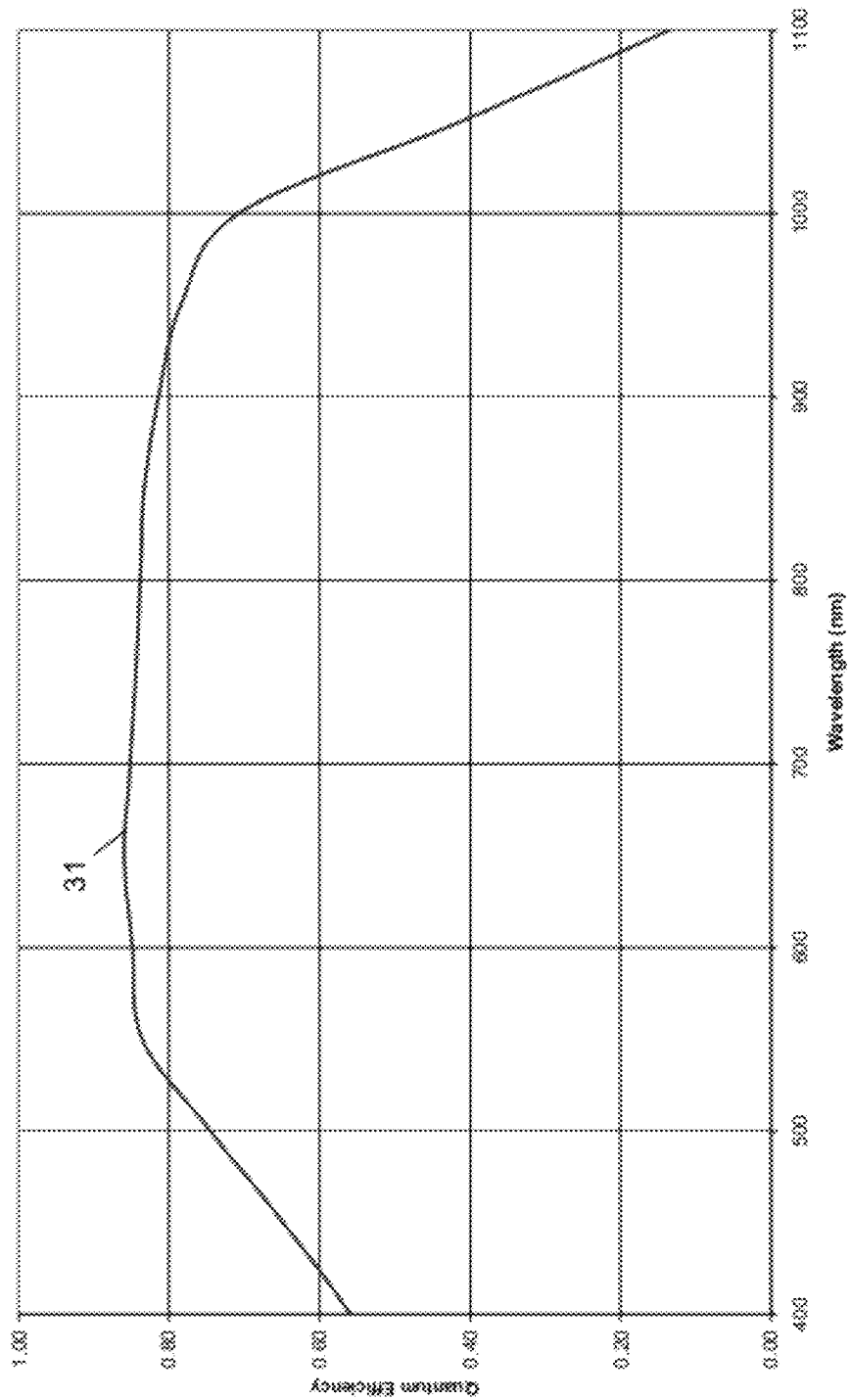
FIG. 6 is a plot of quantum efficiency versus wavelength for a silicon photodiode.

FIG. 6 shows a plot 31 of quantum efficiency versus wavelength for a silicon photodiode. The silicon photodiode is sensitive to electromagnetic radiation having a wavelength in the (approximate) range 350 nm to 1000 nm. The peak quantum efficiency shown in FIG. 6 is approximately 85%. However, it is noted that the plot shown in FIG. 6 is the best possible case and that process steps will typically cause the response to deteriorate slightly, reducing its peak quantum efficiency and causing the curve to dip more towards the longer wavelength end of the spectrum. It will be understood that a similar plot to the one shown in FIG. 6 may be provided for a SPAD based pixel, where the maximum quantum efficiency is typically slightly lower and the bandwidth is also typically slightly narrower. However, it will be assumed that the pixels 10, 11 have quantum efficiency curves which correspond to the one shown in FIG. 6.

Figure 7:
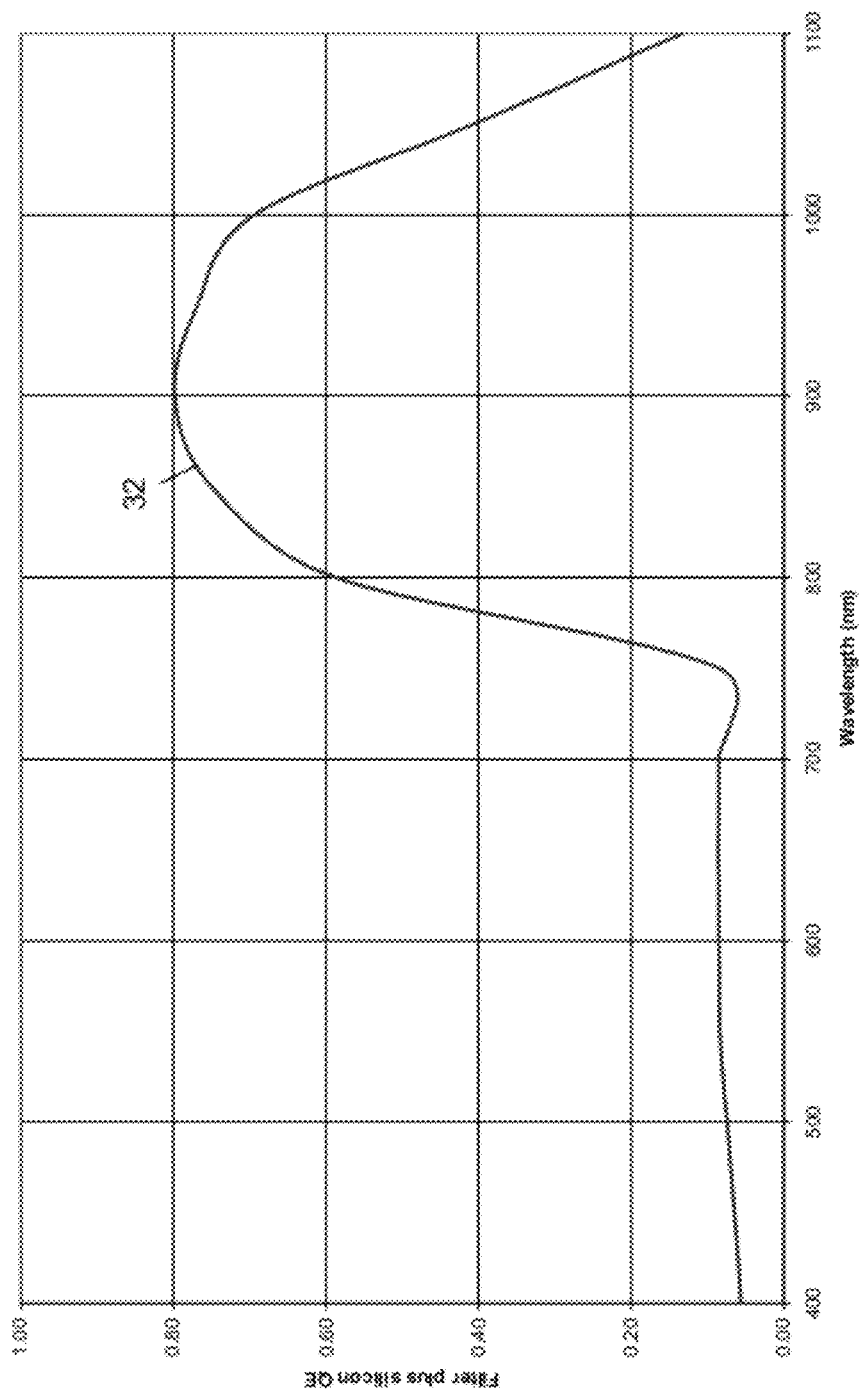
FIG. 7 shows the combined spectral response of the silicon photodiode of FIG. 6 and the radiation absorption filter of FIG. 4.
Figure 8:
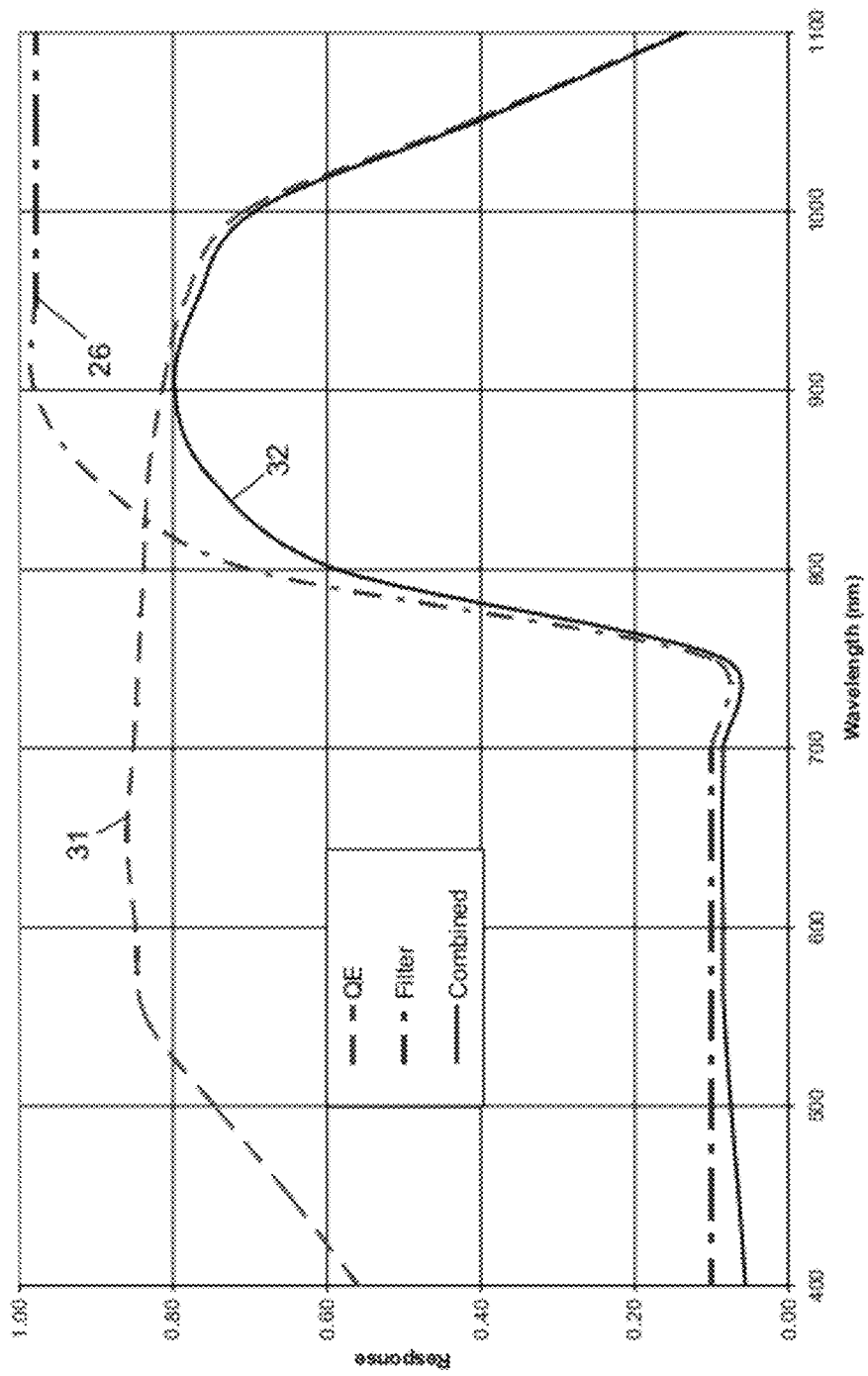
FIG. 8 shows the responses of FIGS. 4, 6 and 7.

FIG. 7 shows the combined spectral response 32 (quantum efficiency vs. wavelength curve in this case) of the radiation absorption filter 16 and the pixel 10. The peak quantum efficiency of the combined response 32 is reduced to approximately 80%. In addition, the radiation absorption filter 16 imposes a lower limit (approx. between 750 nm and 800 nm) on the pass-band of the combined response, while the quantum efficiency curve of the pixel 10 imposes an upper limit (approx. 1000 nm) on the pass-band of the combined response. All three responses (the quantum efficiency curve of pixel 10, the radiation absorption filter spectral response 26 and the combined response 32) are shown in FIG. 8.

The interference filter pass-band centered at 850 nm is substantially within the pass-band of the combined spectral response 32 of the radiation absorption filter 16 and the pixel 10. Also, the interference filter pass-bands centered at 425 nm and 567 nm are substantially within the stop-band of the combined spectral response 32 of the radiation absorption filter 16 and the pixel 10. The interference filter pass-bands have full-width-half-maximum (FWHM) bandwidths which are less than (i.e. narrower than) the FWHM bandwidths of the stop-band and pass-band of the combined response 32 respectively. Therefore, the combined response of the pixel 10, the radiation absorption filter 16 and the interference filter 9 substantially consists of a single pass-band corresponding to the infrared pass-band of the interference filter 9 (centered at 850 nm in this exemplary embodiment). This is the response 'seen' by the first pixel 10, as both the interference filter 9 and the radiation absorption filter 16 are positioned over the first pixel 10. That is, the first pixel 10 only detects radiation having a wavelength within the infrared interference filter pass-band (centered at 850 nm in this exemplary embodiment) and substantially blocks radiation of all other wavelengths.

As only the interference filter 9 is positioned over the second pixel 11, the second pixel 'sees' the combined spectral response of the interference filter 9 and the quantum efficiency curve 31. That is, the second pixel only detects radiation having a wavelength within one of the interference filter pass-bands (centered at 425 nm, 567 nm and 850 nm in this exemplary embodiment) and substantially blocks radiation of all other wavelengths.

As will be described below, the sensor 1 has a proximity sensing mode (during proximity sensing periods 39) and an ambient light sensing mode (during ambient light sensing periods 40 which occur between successive proximity sensing periods 39). The radiation source 17 is activated in proximity sensing mode and the radiation source 17 is deactivated in ambient light sensing mode. By deactivating the source 17 during ambient light sensing periods 40, uncertainty in the ambient light sensing reading is minimized as the sensor 1 detects only ambient light.

Ambient Light Sensing

As described above, the spectral responses of the first and second pixels 10, 11 are substantially identical in the infrared spectral region. Therefore (during the ambient light sensing periods 40), by subtracting the electrical signal produced by the first pixel 10 (obtained from the readout circuitry 18) from the electrical signal produced by the second pixel 11 (obtained from the readout circuitry 19), the infrared content of the ambient light (detected within the infrared pass-bands at 850 nm in each case) is substantially deleted from the second pixel signal. The resultant signal is proportional to the radiation detected at the second pixel 11 within the two visible pass-bands (at 425 nm and 567 nm). That is, the resultant signal provides an indication of the visible ambient light level.

Figure 9:
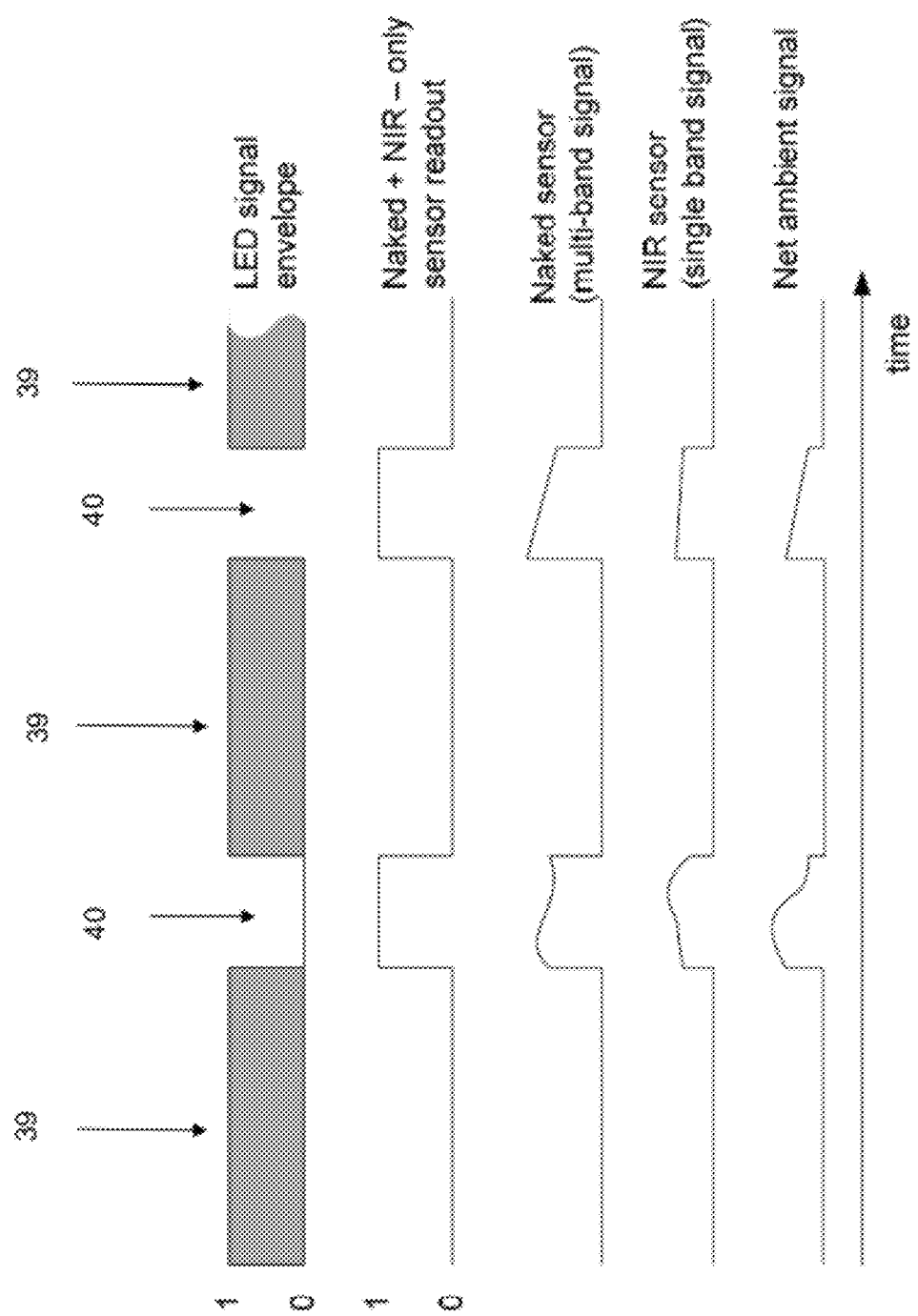
FIG. 9 is a timing diagram illustrating a method of visible ambient light sensing.

This is illustrated in FIG. 9, which is a timing diagram having five rows of signals. The first (top) row, which shows the radiation source signal envelope, indicates the ambient light sensing periods 40 (in which the radiation source is deactivated) and the proximity sensing periods 39 (in which the radiation source is activated). The second row shows the combined read-out status of the readout circuitry 18 and 19, where a '1' indicates 'read' and a '0' indicates 'do not read'. The third row of FIG. 9 shows the output signal from the second pixel 11 during the ambient light sensing periods, while the fourth row of FIG. 9 shows the output signal from the first pixel 10 during the ambient light sensing periods. The fifth (bottom) row of FIG. 9 shows the resultant signal obtained by subtracting the output signal of the first pixel 10 from the output signal of the second pixel 11. As explained above, this resultant signal is proportional to the visible content of the ambient light.

The provision of two visible pass-bands enables the ambient light sensor 1 to detect low levels of visible ambient light which may not be detected if only a visible single pass-band was present. However, it will be understood that an interference filter with more than two visible pass-bands (see FIG. 21 below for example), or only one visible pass-band, may alternatively be employed.

Figure 10:
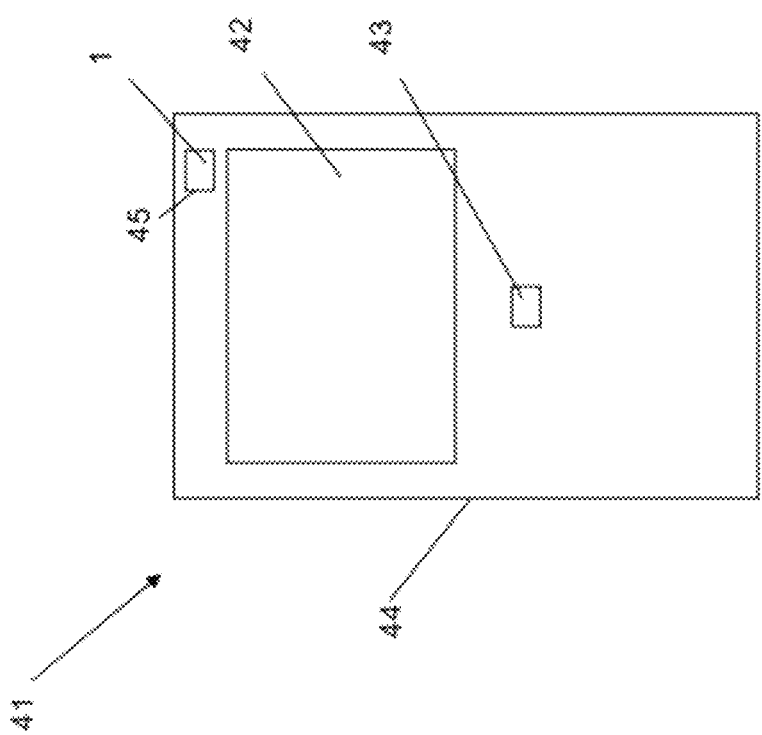
FIG. 10 is a schematic diagram of a mobile communications device.

FIG. 10 shows a mobile communications device 41 comprising: the combined proximity and ambient light sensor 1 described above; a display 42; and a controller 43. All of these features are housed within a device casing 44. The first and second pixels 10, 11 of the sensor 1 are formed under a single, common sensor window 45 within the casing 44 of the device 41. The controller 43 activates the radiation source during the proximity sensing periods 39 and deactivates the radiation source during the ambient light sensing periods 40.

Extreme (either very dark or very bright) levels of visible ambient light can affect a user's perception of the brightness of the display 42. During the ambient light sensing periods 40, the electrical signals produced by the first and second pixels (in response to the detected ambient light) are input to the device controller 43, which subtracts the first pixel signal from the second pixel signal. The resultant signal provides the controller 43 with an indication of the visible content of the detected ambient light (as explained above). The device controller 43 controls the brightness of the display 42 (e.g. by increasing or decreasing the brightness) in response to that indication to optimize the perceived brightness (visibility) of the display 42 to the user.

It will be understood that only the visible content of the ambient light affects the perceived brightness of the display (that is, the infrared ambient light does not affect the perceived brightness). Therefore, by isolating the visible content of the detected ambient light from the infrared ambient light, more accurate feedback data is provided to the device. That is, the device can respond to varying levels in the visible content of the ambient light (e.g. by increasing or decreasing the brightness of the display) without the feedback signal being distorted by infrared ambient light.

Proximity Sensing

Referring again to the example of FIG. 10, the sensor 1 may be used to detect the proximity of an object to the mobile communications device 41. This is done by: activating the radiation source to emit radiation; detecting a portion of the radiation reflected by the object at the first pixel 10 of the sensor 1; and processing the reflected radiation with the controller 43 to calculate the proximity of the object to the mobile communications device 41, for example by using a direct time of flight measurement. It will be understood that any other suitable alternative proximity detection mechanism may be used, such as the Phase Shift Extraction Method (see below). If the object is found to be sufficiently close to the mobile communications device, it is assumed that the user is making a call and the controller 43 may switch off the display 42 completely and/or deactivate one or more user-controls of the device to prevent the user from unintentionally instructing the device to perform a task.

As indicated above, an alternative to basing the proximity sensor on direct time of flight measurements is the Phase Shift Extraction Method. This scheme is favored for SPADs in proximity detection applications and is well suited to systems which implement computation of the generalized range equation (see below). It is also typically robust to background ambient light conditions, and may be adapted to allow for varying modulation wave-shapes (i.e. sinusoidal or square).

It is important to understand the range equation derivation as it indicates the ease of applicability of SPADs to phase extraction proximity detection.

Distance is determined from the speed of light and time of flight (TOF), as follows:

$$s = ct \quad (4)$$

where s is distance, c the speed of light and t is time.

For a proximity sensing system, the distance is doubled due to the fact there are send and receive paths. As such the distance measured in a ranging system s is given by:

$$s = \tfrac{1}{2} ct \quad (5)$$

The time shift component (='t') due to the photon TOF, is dependent on the modulation frequency and phase shift magnitude of the waveform (compared to the radiation emitted from the radiation source).

$$t = \% \text{ shift of the returned waveform} \times t_{mod\_period}$$

and if $t_{mod\_period} = 1/f_{mod}$:

$$\Rightarrow t = \frac{\phi}{2\pi} \circ \frac{1}{f} \quad (6)$$

$$\Rightarrow t = \frac{\phi}{2\pi \circ f} \quad (7)$$

The units are in radians. Then by substituting the above equation back into the starting equation, the 'range equation' is expressed as:

$$\Rightarrow s = \frac{c \circ \phi}{4\pi \circ f} \quad (8)$$

The critical component in this equation is φ, which is the unknown component of the % shift of the returned waveform. The following section discusses how this can be determined.

Figure 11:
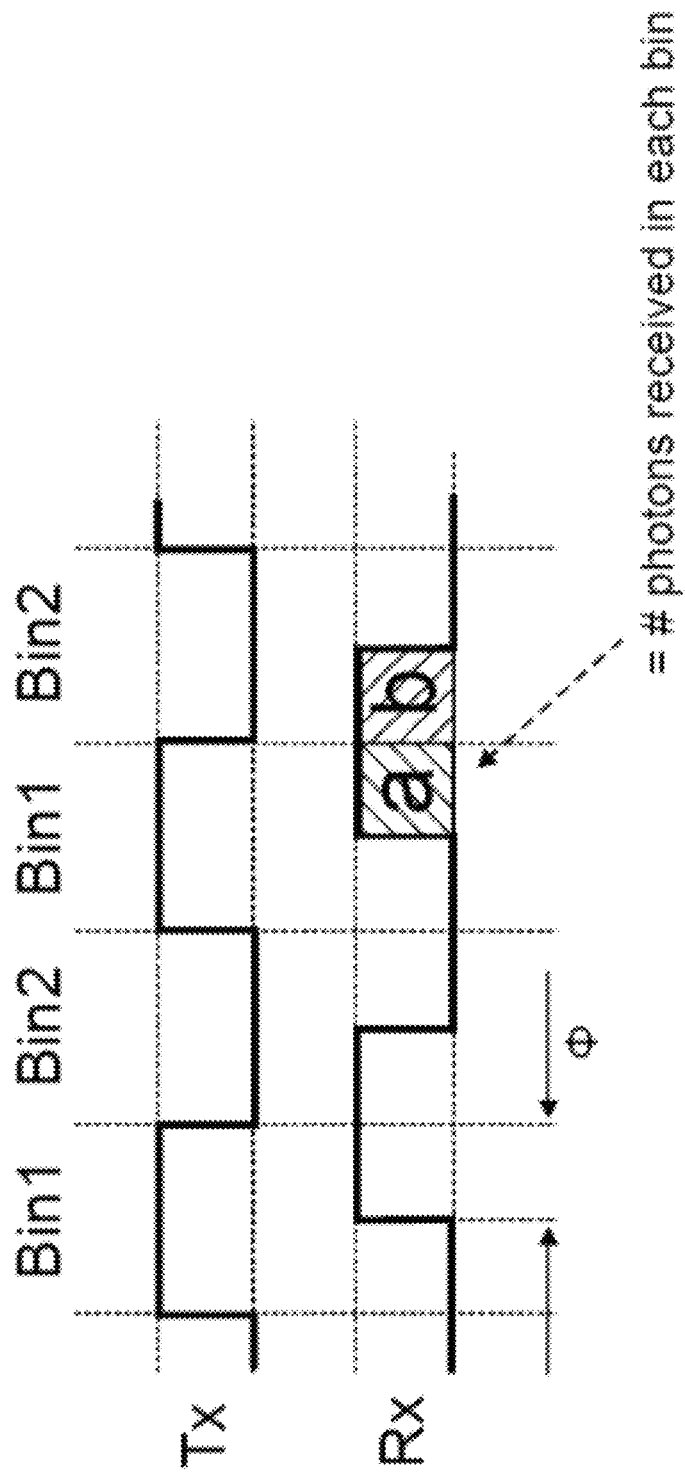
FIG. 11 is a wave diagram illustrating the Phase Shift Extraction Method.

Since the values of c, f and π are all constants; the range result simply scales with φ, (the % shift of the received light waveform in relation to that which was transmitted). FIG. 11 demonstrates how φ may be determined for a system employing a square wave modulated radiation source. The transmitted and received waveforms are shifted from one another by φ. By measuring the photons that arrive in "a" and "b" in bins 1 and 2 respectively the value of φ can be determined as follows:

$$\frac{\phi}{2\pi} = \frac{b_{count}}{(a+b)_{count}} \quad (9)$$

In this type of system there is a range limit set by the radiation source modulation frequency, which is known as the unambiguous range. Photons received from targets that are further away than this range can introduce an aliasing error by erroneously appearing in a legitimate bin for a subsequent measurement. Since determination of range is enabled by the modulation process, it is desirable to maximize the number of edges of the modulation waveform in order to accumulate data for averaging purposes as fast as possible. However, a high modulation frequency may lower the unambiguous range and introduces more technical complexity in the driver circuitry of the radiation source. Therefore, two or more different modulation frequencies may be interleaved or used intermittently, so as to reduce or negate the impact of aliased photons via appropriate data processing.

FIG. 12 illustrates a possible implementation of a SPAD based proximity sensor (as part of the combined proximity and ambient light sensor 1) with an associated waveform diagram. FIG. 12 shows a SPAD 200 (which acts as the first pixel 10) connected to a multiplexer 202. The output from the multiplexer passes through counters 1 and 2 (204). The SPAD shown generally at 200 is of a standard type, including a photo-diode 210, a p-type MOSFET 212 and a NOT gate 214.

The timing waveforms are shown in such a way so as to represent the relative photon arrival magnitudes. It can be seen that an extra phase has been added to enable computation of the background ambient light level offset 'c'. Due to the combination of the radiation absorption filter 16 and the interference filter 9 positioned over the first pixel 10, the value of c will represent only the ambient content of the absorption filter pass-band. The element 'c' can be determined by deactivating the radiation source and measuring the photon flux at the first pixel 10. This measurement of 'c' may then be accommodated in the computation of received light phase shift φ. The computed results for a, b, c are determined and written into either a temporary memory store or an I2C register.

It is noted that the shot noise produced by the SPAD is proportional to the number of electrons it generates. Therefore, the greater the in-band ambient light signal detected by the first pixel 10 during proximity sensing, the greater the shot noise. It is therefore preferable that the field of view of the first pixel 10 is restricted (see below) to minimize the amount of in-band ambient radiation detected during proximity sensing. This decreases the detection time necessary to average out the noise and thus improves the performance of the ambient light sensing function.

The computation of the phase shift φ, is calculated as follows:

$$\phi = \frac{a_{count} - c}{(a+b)_{count} - 2c} \quad (10)$$

The predetermined selection of modulation frequency is performed by dedicated logic or host system which selects a suitable frequency or frequencies for the application of the range sensor. The proximity sensor of FIG. 12 is dependent on the amount of light that can be transmitted on to the scene, system power consumption and the target reflectivity.

Figure 13:
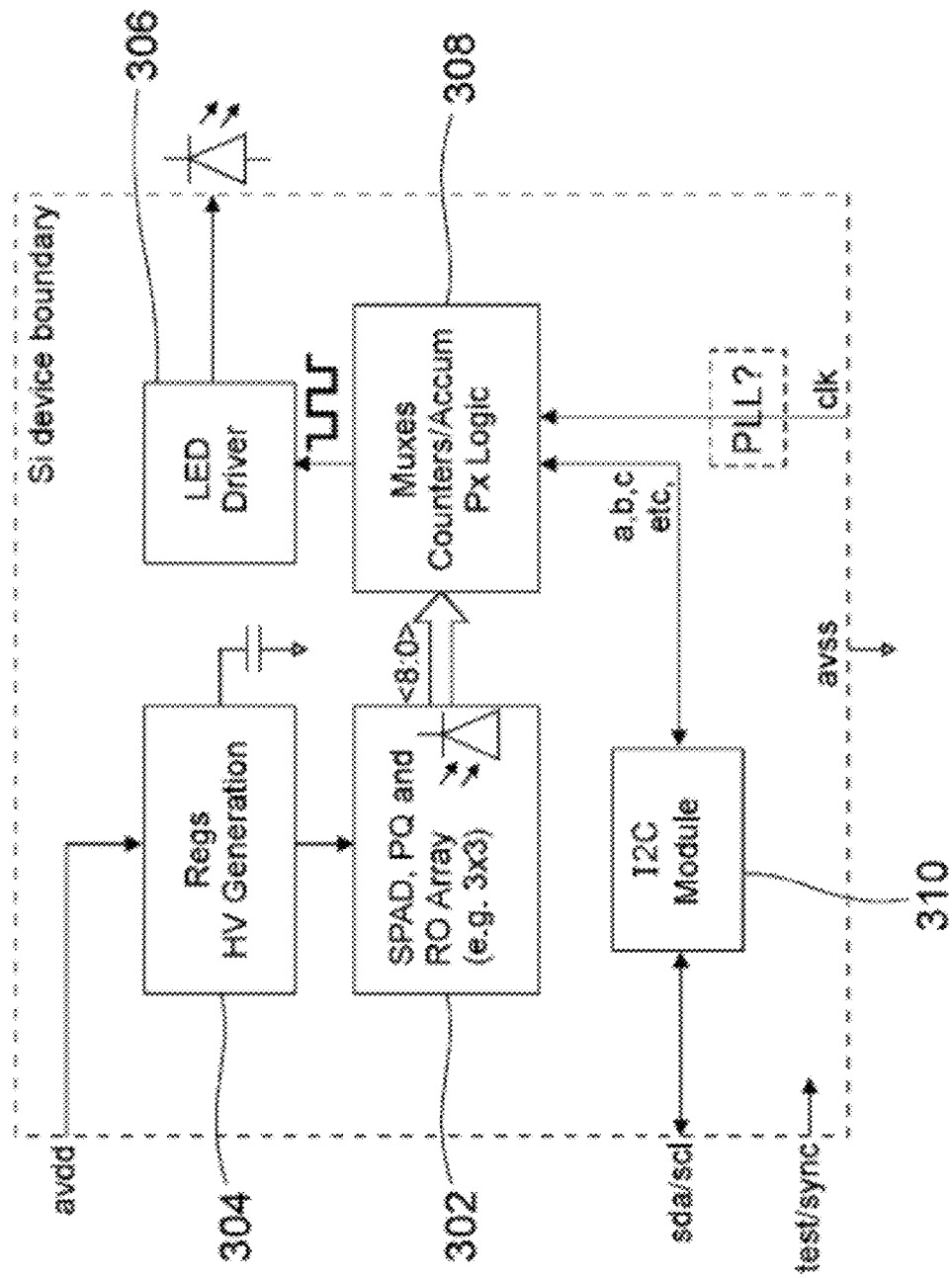
FIG. 13 is a block diagram of a SPAD based proximity sensor.

A block diagram of the required elements for the proximity sensing function of the sensor 1 (where the pixels 10, 11 are SPADs) is shown in FIG. 13. The proximity sensor 300 includes SPAD function and the quenching thereof in block 302. The quenching can be passive as shown or of any other suitable type. The bias voltage for the SPAD may be provided by a charge pump or any other suitable device 304. The sensor also includes the radiation source (such as an LED or semiconductor laser) and an associated driver 306 for applying the required modulation to the radiation source.

The sensor may include a distance computation logic module to determine range. Alternatively this can be located in the mobile communications device 41, optionally as part of the controller 43. The sensor 1 also includes multiplexers and counters 308 and a storage means 310, such as a I2C module. The sensor may also include a Phase Locked Loop (PLL) for clocking and subsequent timed signal generation purposes.

The power consumption of SPADs and their readout circuits is dependent on the incident photon arrival rate. The average power consumption of the proximity sensing function could be reduced by using power saving modes such as pulsed on/off operation, at a rate of ~10 Hz for example, at the expense of target motion distortion.

The sensor 1 may be implemented on a 1 mm² die size and the I2C module could also be implemented on an appropriate die. Optimally the pixel has a field of view of about 30° (see 'Fields of View' section below).

It should be noted that the terms "optical", "illumination" and "light" are intended to cover other wavelength ranges in the spectrum and are not limited to the visual spectrum.

As shown in FIG. 3, the radiation source emission spectrum is centered at the same wavelength as the interference filter pass-band (850 nm in this particular embodiment). By comparing FIG. 3 with FIG. 2, it can be seen that the emission spectrum of the source overlaps the infrared pass-band of the interference filter response 22. To ensure that the (relatively small) reflected radiation signal detected by the first pixel 10 overcomes the in-band ambient light (i.e. the ambient light having wavelengths within the infrared pass-band of the interference filter 9) in the presence of high ambient light levels, it is preferable that the infrared interference filter pass-band matches, or is narrower than, the emission spectrum of the radiation source. Most preferably, the infrared interference filter pass-band only transmits radiation of wavelengths around the peak of the radiation source emission spectrum. For example, the infrared pass-band of the interference filter may be less than the full-width-half-maximum (FWHM) bandwidth (linewidth) of the radiation source emission spectrum.

In the exemplary radiation source emission spectrum shown in FIG. 3, the radiation source 17 has a (FWHM) bandwidth of approximately 50 nm and the interference filter pass-band has a FWHM bandwidth (linewidth) of approximately 15 nm. This ensures that as much of the reflected radiation is detected as possible by the first pixel 10 and that the amount of in-band ambient light detected by the first pixel 10 is minimized. That is, the signal to noise ratio is maximized. This helps to minimize the required power consumption of the radiation source.

The interference filter 9 prevents both the first and second pixels 10, 11 from becoming saturated under high levels of ambient light. As mentioned above, typically the photodetectors (for example silicon photodiodes or SPADs) of pixels 10, 11 are sensitive over the wavelength range 350 nm to 1000 nm respectively. Therefore, in the absence of the interference filter 9, the first pixel 10 would detect ambient light of any wavelength within the pass-band of the radiation absorption filter (i.e. in the exemplary embodiment, above 800 nm) to which it is sensitive (i.e. ~800 nm to 1000 nm). In addition, the second pixel 11 would be able to detect ambient light across all wavelengths to which it is sensitive (350 nm to 1000 nm). However, the visible pass-bands of the interference filter 9 have FWHM bandwidths which are less than the FWHM bandwidth of the stop-band of the combined response of the pixel 10 and the radiation absorption filter 16, while the infrared pass-band of the interference filter has a FWHM bandwidth which is less than the FWHM bandwidth of the combined response of the pixel 10 and the radiation absorption filter 16. Thus, the interference filter 9 causes most wavelengths of radiation (i.e. those outside the interference filter pass-bands) to be blocked, which prevents the pixels 10, 11 from becoming saturated. As either high visible ambient light levels or high infrared ambient light levels (or both) may occur, this improves the reliability of both the ambient light sensing and proximity sensing functions of the sensor.

Alternative Interference Filter Designs

FIG. 14 is a schematic section view of an alternative sensor 50 which is similar to the sensor 1 described above. Identical features will be given the same reference numerals. In this case, an interference filter 52 is integrally formed with the sensor 50 and the interference filter 9 is omitted from the sensor housing. The interference filter 52 is formed from a spacer 54 sandwiched between two partially reflective dielectric stack interference mirrors 56, 58. The spacer 54 is formed from a material (such as silicon nitride) with a higher refractive index than the interference mirrors (which may be formed from a plurality of silicon oxide layers). The interference filter 52 is formed above the first and second pixels 10, 11 as before. However, the radiation absorption filter 16 (which again is positioned over only the first pixel 10) is, in this case, formed on the upper surface 60 of the interference filter. That is, the interference filter 52 is formed between the radiation absorption filter 16 and the first pixel 10 (in contrast to the sensor 1 of FIG. 1 where the radiation absorption filter is positioned between the interference filter 9 and the first pixel 10). The sensor 50 works in a substantially identical manner to the sensor 1 described above.

It is noted that, in the embodiment of FIG. 14, the pixels 10, 11 are formed on a CMOS chip and the dashed lines 59 represent the metal electrodes of the chip.

FIG. 15 is a schematic section view of another alternative sensor 70 which is similar to the sensor 50 described above. Identical features will be given the same reference numerals. In this case, the interference filter 72 is again integrally formed with the sensor chip. However, the interference filter 72 is formed from a pair of opposing semi-transparent mirrors 74, 76. An air gap 78 may be left between the mirrors 74, 76. Alternatively the gap may 78 be formed by a dielectric layer, preferably of silicon oxide or silicon nitride.

Again, in the embodiment of FIG. 15, the pixels 10, 11 are formed on a CMOS chip and the dashed lines 79 represent the metal electrodes of the chip.

Optics

Figure 16:
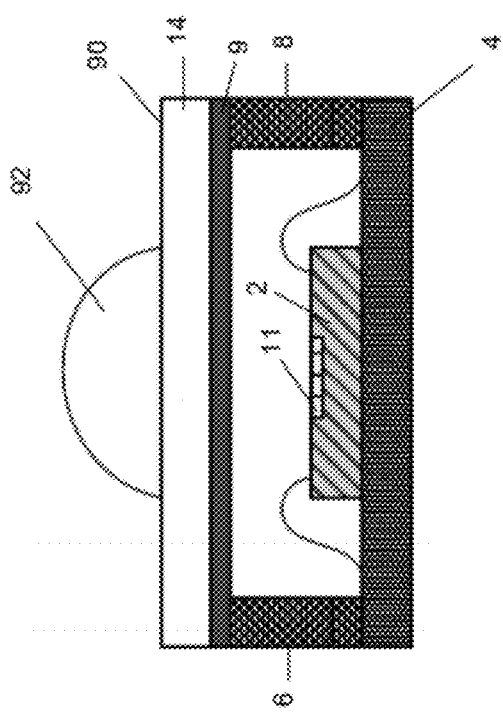
FIG. 16 is a schematic section of a radiation sensor similar to that of FIG. 1 with a hemispherical lens mounted on an upper surface of the glass substrate.

FIG. 16 shows the sensor 1 described above. A hemispherical lens 92 is attached to (or formed on) the upper surface 90 of the glass substrate 14. The lens 92, which helps to focus incident light onto the pixels 10, 11, may be integrally formed with the glass substrate 14. Alternatively, the lens 92 may be formed separately and subsequently attached to the substrate 14 with, for example, transparent adhesive. The lens 92 has an exposed external convex surface which faces away from the sensor housing. In the embodiment of FIGS. 16 to 19, the pixels 10, 11 are adjacent pixels in a pixel array (as opposed to being separated by a portion of the substrate 2 as per the embodiment of FIG. 1).

Figure 17:
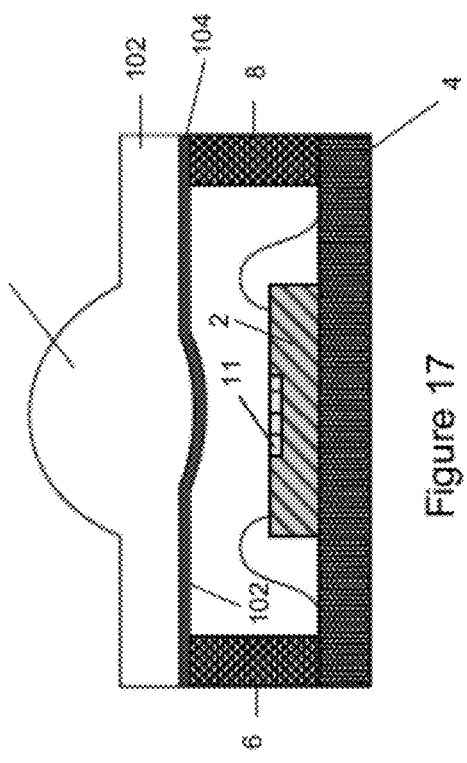
FIG. 17 is a schematic section of a similar radiation sensor to that of FIG. 16 where a hemispherical lens is integrally formed with the glass substrate.

FIG. 17 shows the sensor 1 described above in alternative sensor housing. The alternative sensor housing is similar to the housing shown in FIG. 1 and identical features will be given the same reference numerals. In this case, a hemispherical lens 100 is integrally formed with an alternative glass substrate 102. Again, the lens 100 has an exposed external convex surface which faces away from the sensor housing. In this case, the interference filter 104 is formed by applying a dielectric optical thin-film filter coating to the lower surface of the glass substrate 102.

Figure 18:
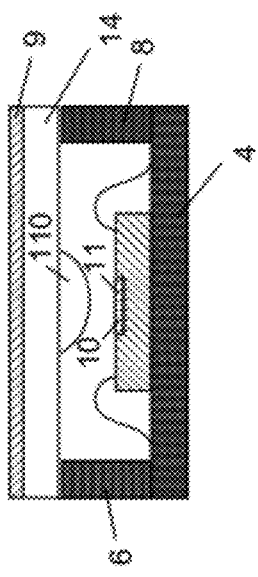
FIG. 18 is a schematic section of a similar radiation sensor to that of FIG. 16 where the hemispherical lens is attached to the lower surface of the glass substrate.

FIG. 18 shows another alternative sensor housing configuration. In this case, an interference filter 9 is formed on the upper surface 15 of the glass substrate 14. In addition, a hemispherical lens 110 is affixed to (or integrally formed with) the lower surface 13 of the glass substrate 14 between the interference filter 9 and the pixels 10, 11. The hemispherical lens 110 has a convex external surface which faces the sensing surfaces of the pixels 10, 11.

Figure 19:
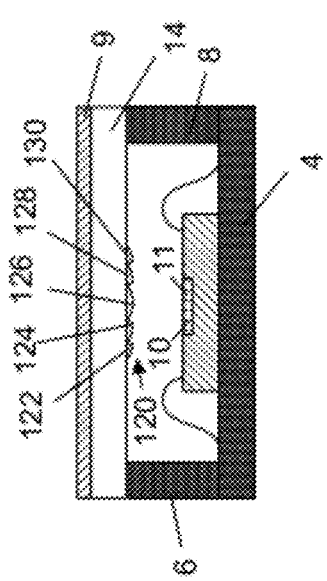
FIG. 19 is a schematic section of a similar radiation sensor to that of FIG. 18 where a Fresnel lens is attached to the lower surface of the glass substrate in place of the hemispherical lens.

FIG. 19 shows yet another alternative sensor housing configuration. In this case, the interference filter 9 is again formed on the upper surface 15 of the glass substrate. In addition, a Fresnel lens 120 is affixed to the lower surface 13 of the substrate 14 between the interference filter 9 and the pixels 10, 11. The Fresnel lens comprises a central lensing element 126 provided between inner lensing ridges 124, 128 which are in turn provided between outer lensing ridges 122 and 130. The lensing element 126 and the lensing ridges 122, 124, 128, 130 face the sensing surfaces of the pixels 10, 11.

As the sensor 1 is not intended to "create an image" but is instead used to ensure that as many photons as possible are detected, the lenses 92, 100, 110, 120 may be made by injection molding.

Different Fields of View

In all of the above embodiments of the combined proximity and ambient light sensor, the second pixel 11 requires a wide field of view as it is necessary to detect ambient light levels over at least a significant portion of the hemisphere of illumination which can affect the flat surface of the display 42 of the device 43. Conversely, the first pixel 10 preferably has a narrow field of view to minimize in-band ambient radiation (i.e. the radiation transmitted by the combination of the radiation absorption filter and the interference filter provided over the first pixel) it captures (to minimize shot noise). For proximity sensing, as the radiation emitted from the radiation source (and reflected back from the object whose proximity is being detected) is typically directed within a narrow field of view over the required proximity sensing range (typically of the order 0.01 m to 0.5 m), a sufficient quantity of the reflected radiation can be detected to overcome the in-band ambient radiation levels without having to average out the ambient radiation levels for too long. This also helps the power consumption of the radiation source to be minimized.

The first and second pixels 10, 11 can be provided with different fields of view as described below.

Figure 20:
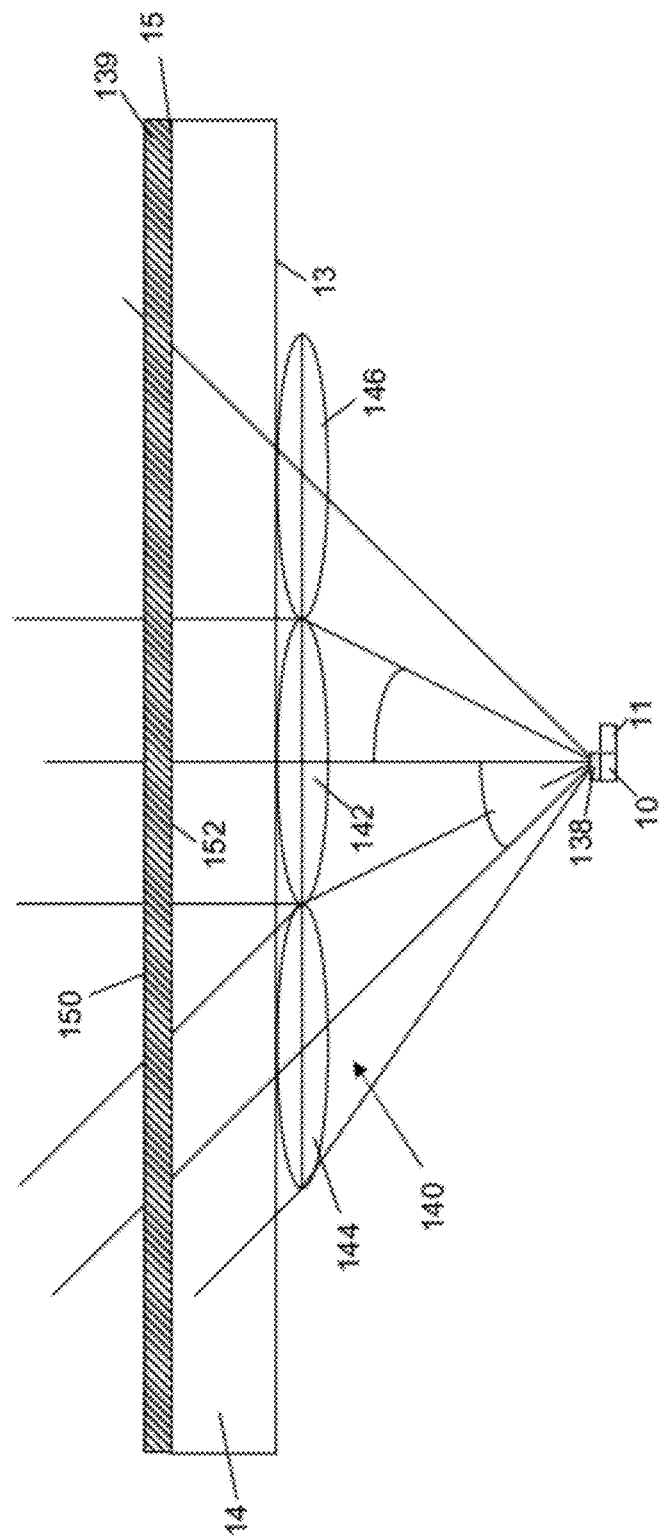
FIG. 20 is a close-up schematic view of a similar radiation sensor to that of FIG. 19 comprising three lenslets attached to the lower surface of the glass substrate.

FIG. 20 is a close up schematic view of a similar sensor to that shown in FIG. 19. Identical features will be given the same reference numerals. A radiation absorption filter 138 is formed on the sensing surface of the first pixel 10, and an interference filter 139 is provided on the upper surface 15 of the substrate 14, the interference filter being positioned over the first and second pixels 10, 11. In addition, a lens 140 having a central lensing element 142 disposed between two adjacent outer lensing elements 144, 146 is attached to (or integrally formed with) the lower surface 13 of the substrate 14 facing the sensing surfaces of the pixels 10, 11. In this case, the lensing elements 142-146 are lenslets rather than Fresnel lensing elements/ridges.

The lensing elements 142-146 are arranged to increase the field of view of the pixels 10, 11 (in particular the second pixel 11 as explained below). Each lensing element 142-146 has a substantially identical F number, $F_\#$. The angles $\alpha$ and $\beta$ shown in FIG. 20 have the following relationship to the F number of the lensing elements:

$$\tan\alpha = \frac{1}{F_\#} \quad (11)$$

$$\tan\beta = \frac{1}{2F_\#} \quad (12)$$

From equations (1), (2) and (3) provided above, it can be seen that the transmission of an etalon filter is dependent on the angle of incidence of light on the plane mirrors. That is, the spectral response of an etalon filter changes depending on the angle of incidence of light on the reflective surfaces of the filter.

In the embodiment shown in FIG. 20, the reflective surfaces are provided by the upper and lower surfaces 150, 152 of the interference filter 139. As light is incident on the upper surface 150 of the interference filter 139 (before being subsequently reflected between the upper and lower surfaces 150, 152), the spectral response of the interference filter 139 is dependent on the angle of incidence of radiation on the upper surface 150.

Figure 21:
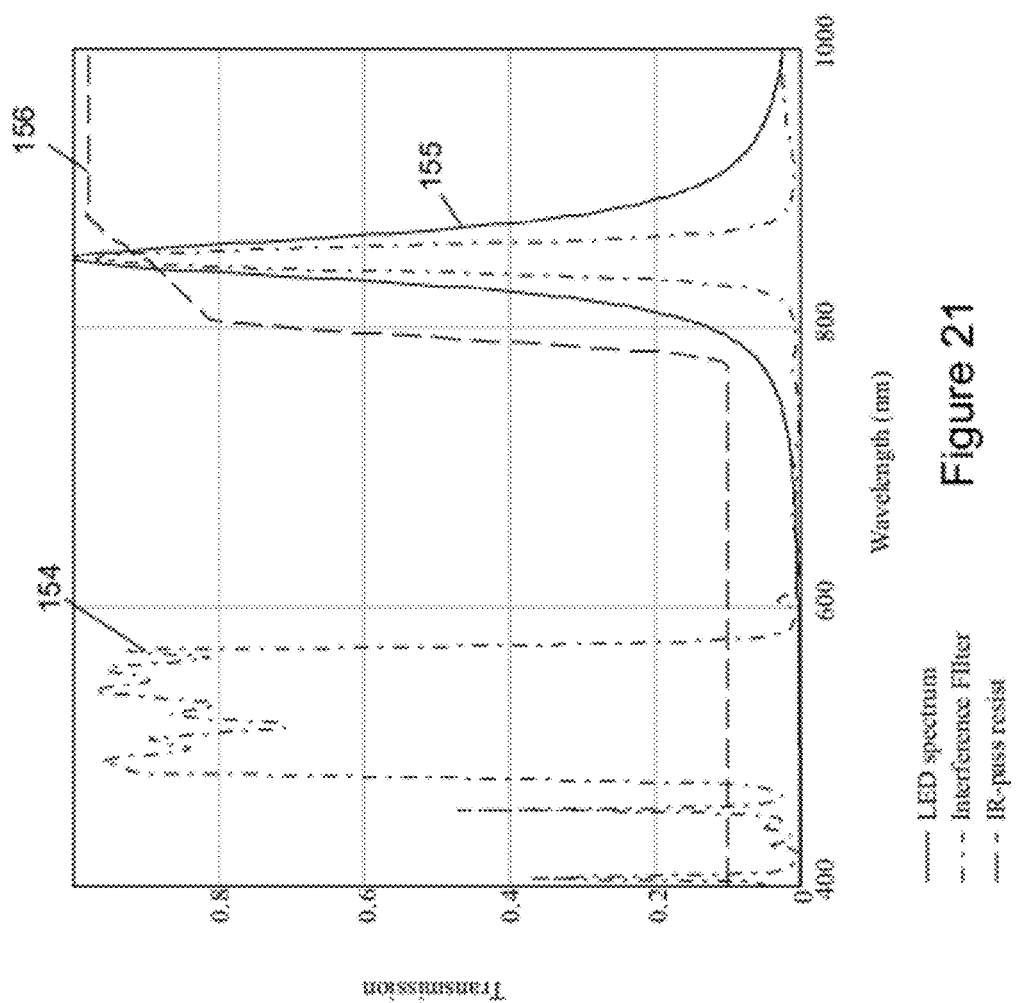
FIG. 21 is a graph showing the spectral responses of the interference filter and radiation absorption filter of the sensor of FIG. 20, together with the output spectrum of a radiation source.

FIG. 21 shows the spectral response 154 of the interference filter 139 for radiation which is incident on the upper surface 150 of the interference filter at an angle of incidence of 0°. Also shown are the spectral response 155 of the radiation source (which in this case is an LED) and the spectral response 156 of the radiation absorption filter 138. The interference filter 139 has a bell-shaped infrared pass-band centered at 850 nm and a plurality of overlapping visible pass-bands extending between 400 nm and 600 nm. The LED output spectrum is also bell-shaped and is centered on 850 nm. The LED output spectrum has a FWHM line-width of approximately twice that of the infrared pass-band of the interference filter 143. The spectral response 156 of the radiation absorption filter 138 is similar to the response 26 of the radiation absorption filter 16 described above. It will be understood that the pixels 10, 11 have the quantum efficiency curve shown in FIG. 6 and that, the combined spectral response of the first pixel 10 and the radiation absorption filter 138 corresponds to that shown in FIGS. 7 and 8.

Figure 22:
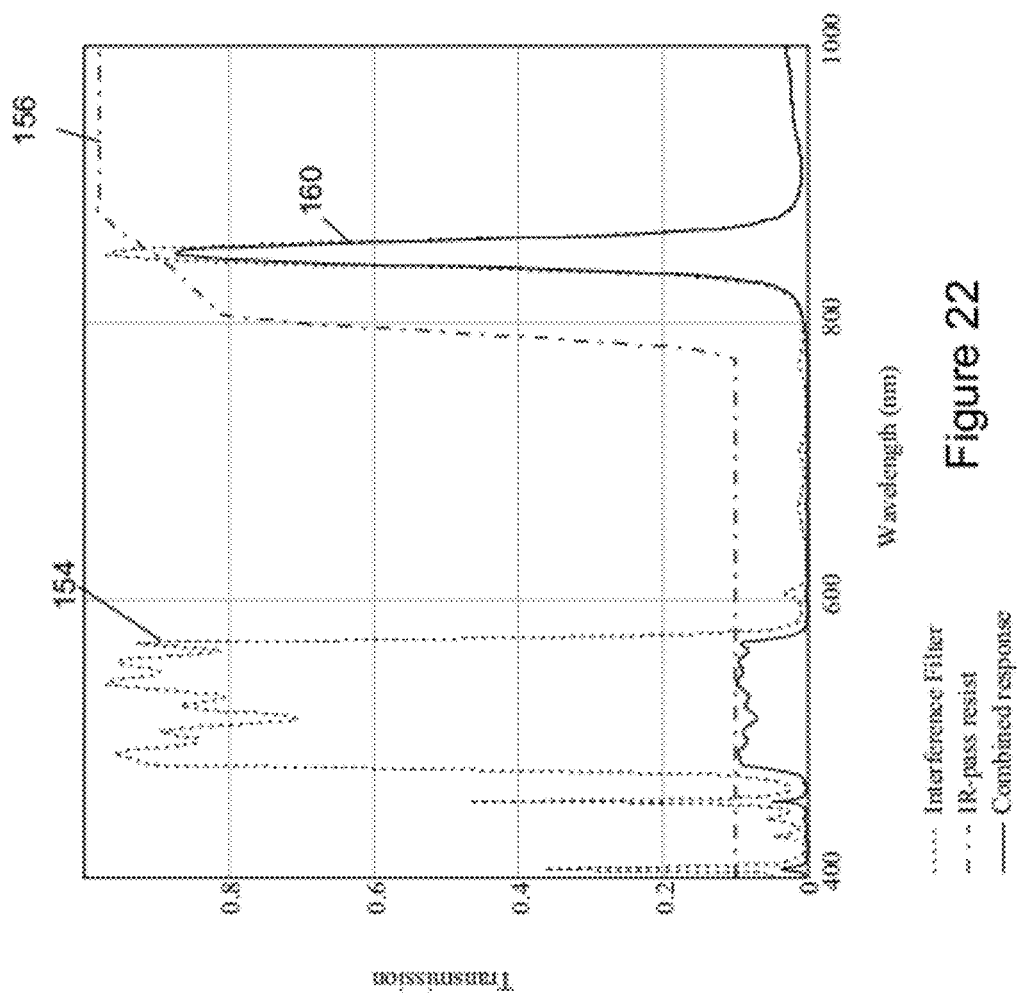
FIG. 22 shows the combined spectral response of the interference filter and radiation filter having the responses shown in FIG. 21.

FIG. 22 shows the combined response 160 of the interference filter 139 and the radiation absorption filter 138 (along with the individual responses of these filters 154 and 156 respectively) as 'seen' by the first pixel 10 for light which is incident on the upper surface 150 of the interference filter 139 at an angle of incidence of 0°. The combined response 160 has an infrared pass-band (centered on 850 nm) which has a peak transmission of approximately 0.85 (or 85%). Note that the influence of the pixel 10 quantum efficiency response is not shown in this case.

Figure 23:
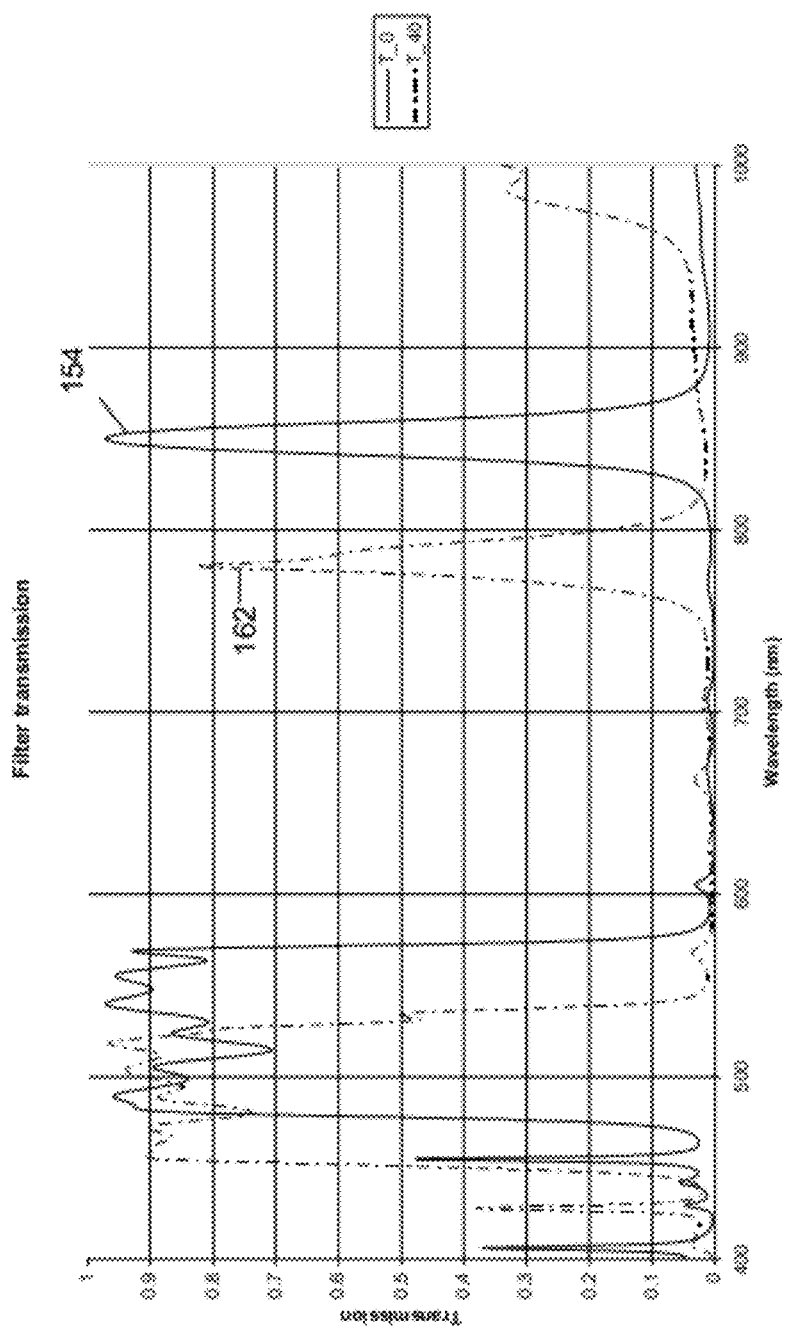
FIG. 23 shows the spectral responses of the interference filter of FIGS. 21 and 22 for radiation having angles of incidence of 0° and 40° on the upper surface of the interference filter.

FIG. 23 shows the spectral responses 154, 162 of the interference filter 139 for light which is incident on the upper surface 150 at angles of incidence of 0° and 40° respectively. As the angle of incidence increases from 0° to 40°, the center wavelength of the infrared pass-band decreases from 850 nm to approximately 780 nm, while the wave-band occupied by the overlapping visible pass-bands move to the spectral region between approximately 340 nm and 540 nm.

Figure 24:
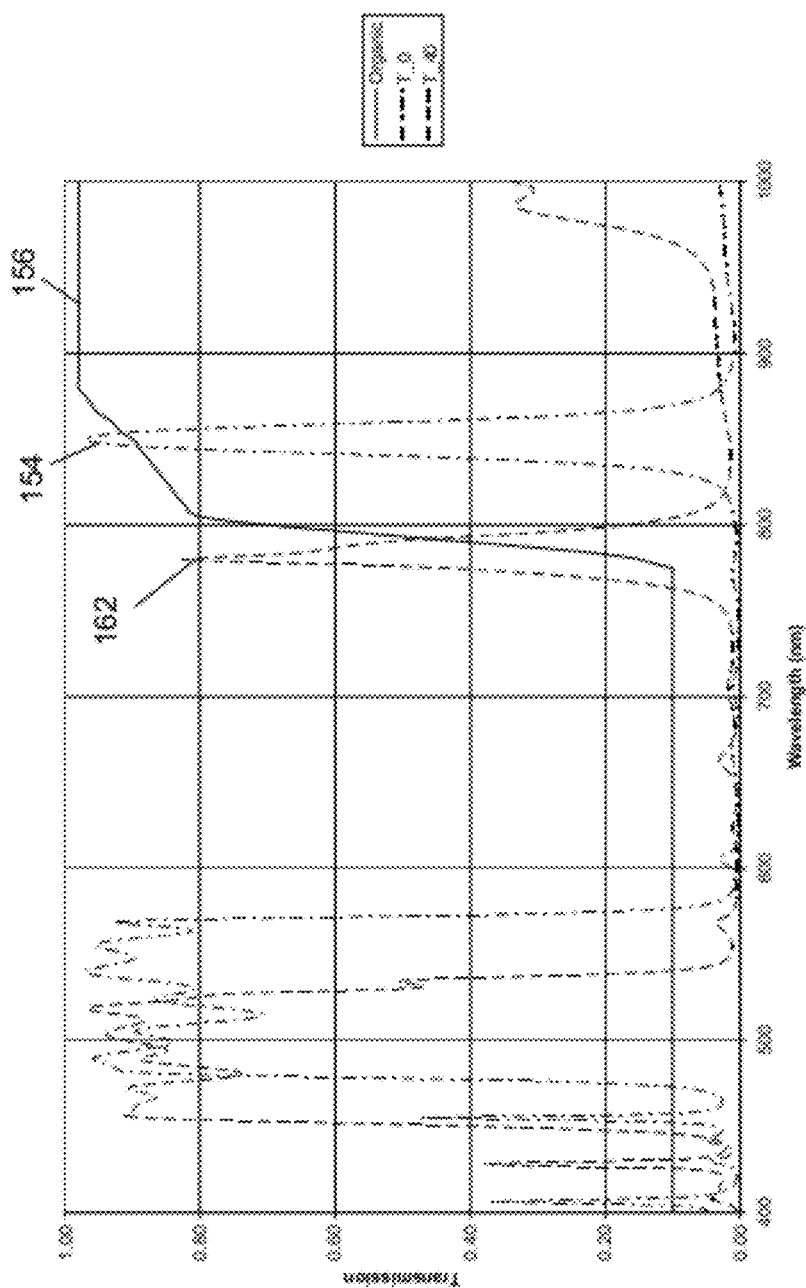
FIG. 24 shows the responses of FIG. 23 along with the response shown in FIG. 21 for the radiation absorption filter.
Figure 25:
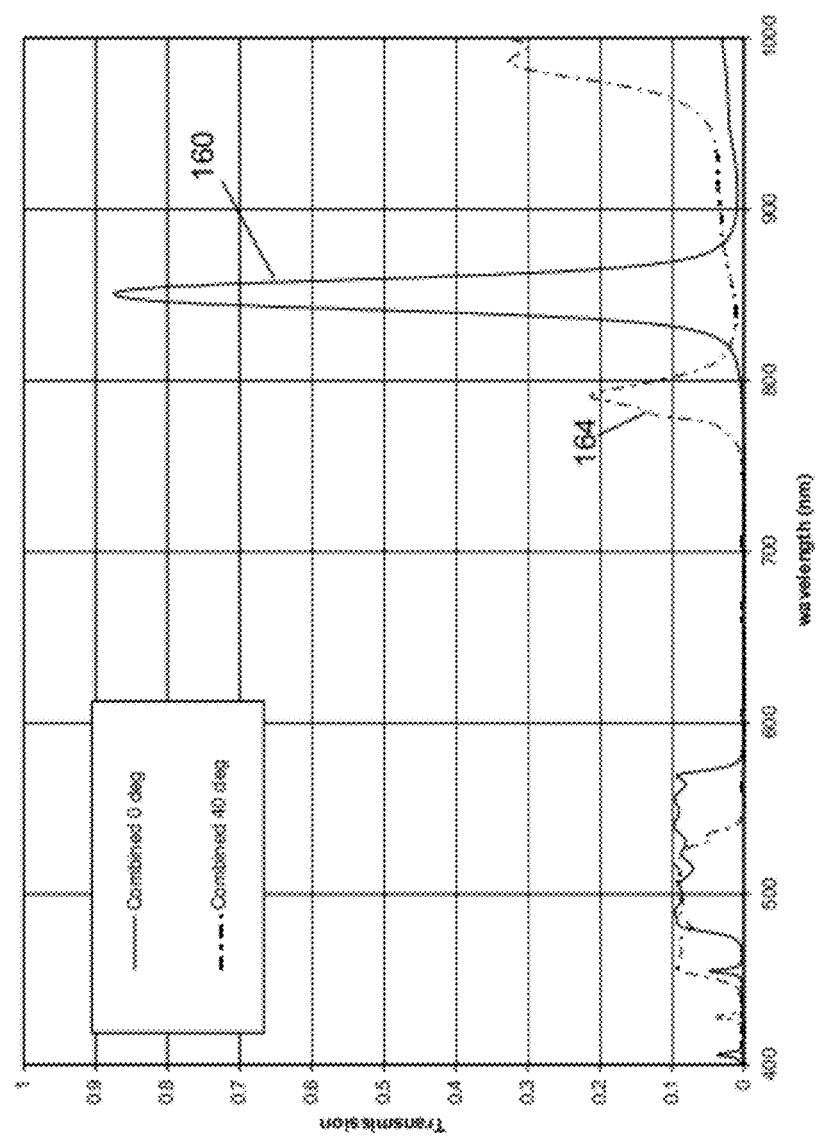
FIG. 25 shows the combined spectral responses of the interference filter and the radiation absorption filter for radiation rays having angles of incidence of 0° and 40° on the upper surface of the interference filter.

FIG. 24 shows the two responses 160, 162 shown in FIG. 23 along with the response 156 of the radiation absorption filter 138. As the angle of incidence increases towards 40° and beyond, the infrared pass-band of the interference filter 139 moves from the pass-band into the stop-band of the radiation absorption filter 138 (and thus from the pass-band to the stop-band of the combined response of the first pixel 10 and the absorption filter 138). This is illustrated more clearly in FIG. 25 which shows the combined responses 160, 164 of the radiation absorption filter 138 and the interference filter 139 for light with angles of incidence of 0° and 40° respectively. At an angle of incidence of 40°, the infrared pass-band of the interference filter is not fully within the stop-band. However, it is substantially within the stop-band. More specifically, the combined response 164 for light incident at 40° has a peak transmission of approximately 0.2 (or 20%) compared with 0.85 (or 85%) for the 0° response 160.

The spectral response of the first pixel 10 is determined by the combination of both filters 138, 139 (and by the quantum efficiency response of the pixel detector). Thus, when the angle of incidence of light on the upper surface 150 approaches 40° and beyond, the transmission of the only pass-band in the spectral response of the first pixel 10 decreases from 0.85 to 0.2 (and lower as the angle of incidence increases beyond 40°). This effectively provides the first pixel with a field of view which is restricted to approximately that given by the central lens 142. As explained above, this minimizes the ambient radiation detected by the first pixel which helps to minimize the power consumption of the radiation source.

The second pixel 11 is covered only by the interference filter 139 (and not the radiation absorption filter 138). Therefore, although the spectral position of the pass-bands of the second pixel's spectral response will also depend on the angle of incidence of the light entering the upper surface 150 of the interference filter 139, the overall level of transmission will remain substantially unchanged.

In order to calculate the visible ambient light content of the second pixel signal as explained above, the in-band infrared content measured by the first pixel 10 during ambient light sensing periods 40 can be scaled to take account of the fact that the pixels 10, 11 have different fields of view (and so detect different quantities of ambient radiation).

It will be understood that the above wavelength values are for illustrative purposes only.

It will be also understood that other alternative lensing configurations may be employed. For example, as illustrated in FIG. 1, no additional lens may be provided. Alternatively, as shown in FIGS. 14 to 17, the interference filter may be provided between the lens and the pixels. However, the most preferable configuration is to have a plurality of lenslets positioned between the interference filter and the pixels 10, 11 as this provides the sharpest cut-off in spectral response when the angle of incidence of the radiation on the etalon exceeds a particular value.

It will thus be understood that the above principles equally apply to the embodiments illustrated in FIG. 1 and in FIGS. 14-19.

While this detailed description has set forth some embodiments of the present disclosure, the appended claims cover other embodiments of the present disclosure which may differ from the described embodiments according to various modifications and improvements.

What is claimed is:

1. A radiation sensor comprising:
   first and second pixels;
   a radiation absorption filter positioned over the first pixel but not the second pixel, wherein a combined spectral response of the radiation absorption filter and the first pixel has a first pixel pass-band and a first pixel stop-band; and
   an interference filter positioned over the first and second pixels, wherein a spectral response of the interference filter has an interference filter pass-band which is substantially within the first pixel pass-band for radiation incident on the interference filter at a first angle of incidence, and substantially within the first pixel stop-band for radiation incident on the interference filter at a second angle of incidence greater than the first angle of incidence.

2. The radiation sensor of claim 1 wherein the interference filter pass-band has a full-width-half-maximum bandwidth which is less than a full-width-half-maximum bandwidth of the first pixel pass-band.

3. The radiation sensor of claim 1 wherein the interference filter pass-band has a full-width-half-maximum bandwidth which is less than a full-width-half-maximum bandwidth of the first pixel stop-band.

4. The radiation sensor of claim 1 wherein the interference filter pass-band has a full-width-half-maximum bandwidth which is less than a full-width-half-maximum bandwidth of the first pixel pass-band and the full-width-half-maximum bandwidth of the interference filter pass-band is less than a full-width-half-maximum bandwidth of the first pixel stop-band.

5. The radiation sensor of claim 1 wherein the interference filter pass-band has a full-width-half-maximum bandwidth which is less than a 10 dB bandwidth of the first pixel pass-band.

6. The radiation sensor of claim 1 wherein the interference filter pass-band has a full-width-half-maximum bandwidth which is less than a 10 dB bandwidth of the first pixel stop-band.

7. The radiation sensor of claim 1 wherein the interference filter pass-band has a full-width-half-maximum bandwidth which is less than a 10 dB bandwidth of the first pixel pass-band and the full-width-half-maximum bandwidth of the interference filter pass-band is less than a 10 dB bandwidth of the first pixel stop-band.

8. The radiation sensor of claim 1 wherein the radiation absorption filter is a high-pass filter configured to transmit radiation having a wavelength above a predetermined threshold.

9. The radiation sensor of claim 1 wherein the first and second angles of incidence are less than 90°.

10. The radiation sensor of claim 1 further comprising a lens substantially positioned over the first and second pixels.

11. The radiation sensor of claim 10 wherein the lens is a Fresnel lens.

12. The radiation sensor of claim 10 wherein the lens comprises one of a plurality of lenslets or a diffractive optical element positioned over the first and second pixels.

13. The radiation sensor of claim 10 wherein the lens is positioned between the interference filter and the first and second pixels.

14. The radiation sensor of claim 1 wherein the interference filter comprises a pair of opposing planar reflectors.

15. The radiation sensor of claim 14 wherein at least one of the planar reflectors is only partially reflective.

16. The radiation sensor of claim 1 wherein the interference filter is provided on a substrate.

17. The radiation sensor of claim 16 wherein the interference filter is formed from a coating applied to the substrate.

18. The radiation sensor of claim 1 wherein the radiation absorption filter comprises an organic resist applied to a sensing surface of the first pixel.

19. The radiation sensor of claim 1 wherein the first pixel stop-band substantially comprises wavelengths between 513 nm and 608 nm.

20. The radiation sensor of claim 1 wherein the first pixel pass-band comprises wavelengths exceeding 700 nm.

21. The radiation sensor of claim 1 wherein the interference filter comprises a second interference filter pass-band, the interference filter being configured such that the second interference filter pass-band is substantially within the first pixel stop-band for radiation incident on the interference filter at the first angle of incidence.

22. A combined proximity and ambient light sensor comprising:
   first and second pixels;
   a radiation absorption filter positioned over the first pixel but not the second pixel, wherein a combined spectral response of the radiation absorption filter and the first pixel has a first pixel pass-band and a first pixel stop-band; and
   an interference filter positioned over the first and second pixels, wherein a spectral response of the interference filter has an interference filter pass-band which is substantially within the first pixel pass-band for radiation incident on the interference filter at a first angle of incidence, and substantially within the first pixel stop-band for radiation incident on the interference filter at a second angle of incidence greater than the first angle of incidence.

23. The combined proximity and ambient light sensor of claim 22 further comprising a radiation source.

24. The combined proximity and ambient light sensor of claim 23 wherein the radiation source is one of a light emitting diode or a semi-conductor laser diode.

25. The combined proximity and ambient light sensor of claim 23 wherein the radiation source has an emission spectrum having a full-width-half-maximum line-width which is greater than a full-width-half-maximum line-width of the interference filter pass-band.

26. The combined proximity and ambient light sensor of claim 22 wherein the first pixel is used for proximity sensing.

27. The combined proximity and ambient light sensor of claim 26 wherein the second pixel is used for ambient light sensing.

28. The combined proximity and ambient light sensor of claim 27 wherein the first pixel is used in combination with the second pixel for ambient light sensing.

29. A method of manufacturing a radiation sensor including first and second pixels, the method comprising:
positioning a radiation absorption filter over the first pixel; and
positioning an interference filter over the first and second pixels,
wherein a combined spectral response of the radiation absorption filter and the first pixel has a first pixel pass-band and a first pixel stop-band and
wherein positioning the interference filter comprises providing the interference filter with an interference filter pass-band which is substantially within the first pixel pass-band for radiation incident on the interference filter at a first angle of incidence, and substantially within the first pixel stop-band for radiation incident on the interference filter at a second angle of incidence greater than the first angle of incidence.

30. The method of claim 29 wherein positioning the radiation absorption filter comprises depositing the radiation absorption filter on a sensing surface of the first pixel by lithography.

31. The method of claim 29 wherein positioning the interference filter comprises integrally forming the interference filter with the first and second pixels.

32. The method of claim 29 wherein positioning the interference filter comprises forming the interference filter by applying a coating to a substrate mounted above the first and second pixels.

33. The method of claim 29 further comprising:
providing a plurality of first and second pixels;
positioning a radiation absorption filter over each of the first pixels; and
positioning an interference filter over the first and second pixels.

34. The method of claim 29 wherein the first and second pixels are provided as part of a pixel array.

* * * * *